United States Patent
Thomas et al.

(10) Patent No.: US 12,328,912 B2
(45) Date of Patent: Jun. 10, 2025

(54) NANORIBBON-BASED QUANTUM DOT DEVICES

(71) Applicant: Intel Corporation, Santa Clara, CA (US)

(72) Inventors: Nicole K. Thomas, Portland, OR (US); Payam Amin, Portland, OR (US); Ravi Pillarisetty, Portland, OR (US); Hubert C. George, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 758 days.

(21) Appl. No.: 17/558,207

(22) Filed: Dec. 21, 2021

(65) Prior Publication Data

US 2023/0197833 A1 Jun. 22, 2023

(51) Int. Cl.
*H10D 48/38* (2025.01)
*G06N 10/40* (2022.01)
(Continued)

(52) U.S. Cl.
CPC .......... *H10D 48/383* (2025.01); *G06N 10/40* (2022.01); *H03K 17/92* (2013.01);
(Continued)

(58) Field of Classification Search
CPC ............ H10D 84/0193; H10D 84/853; H10D 48/383; H10D 30/6733; H10D 62/8181; H10D 30/6735; H10D 62/118; H10D 48/3835; H10D 30/402; H10D 62/812; H10D 64/27; H10D 86/201; H10D 84/85; H10D 30/6728; H10D 89/931; H10D 64/252; H10D 84/0188; H10D 84/201; H10D 18/60; H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086;
(Continued)

(56) References Cited

U.S. PATENT DOCUMENTS

2013/0264617 A1 10/2013 Joshi et al.
2019/0131511 A1 5/2019 Clarke et al.
(Continued)

*Primary Examiner* — Moin M Rahman
(74) *Attorney, Agent, or Firm* — Akona IP PC

(57) ABSTRACT

Quantum dot devices and related methods and systems that use semiconductor nanoribbons arranged in a grid where a plurality of first nanoribbons, substantially parallel to one another, intersect a plurality of second nanoribbons, also substantially parallel to one another but at an angle with respect to the first nanoribbons, are disclosed. Different gates at least partially wrap around individual portions of the first and second nanoribbons, and at least some of the gates are provided at intersections of the first and second nanoribbons. Unlike previous approaches to quantum dot formation and manipulation, nanoribbon-based quantum dot devices provide strong spatial localization of the quantum dots, good scalability in the number of quantum dots included in the device, and/or design flexibility in making electrical connections to the quantum dot devices to integrate the quantum dot devices in larger computing devices.

17 Claims, 21 Drawing Sheets

(51) Int. Cl.
*H03K 17/92* (2006.01)
*H10D 30/67* (2025.01)
*H10D 48/00* (2025.01)
*H10D 62/815* (2025.01)
*H10D 62/10* (2025.01)

(52) U.S. Cl.
CPC ..... *H10D 30/6733* (2025.01); *H10D 62/8181* (2025.01); *H10D 30/6735* (2025.01); *H10D 62/118* (2025.01)

(58) Field of Classification Search
CPC ......... H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; G06N 10/40; H03K 17/92; B82Y 10/00; H02K 15/027; A23B 2/783; A45C 11/003; A61K 40/4218; H10F 77/955; H10H 20/826
See application file for complete search history.

(56) References Cited

U.S. PATENT DOCUMENTS

| | | |
|---|---|---|
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1* | 11/2019 | Pillarisetty ......... H10D 30/6748 |
| 2019/0363239 A1 | 11/2019 | Yoscovits et al. |
| 2020/0161455 A1 | 5/2020 | Singh et al. |

* cited by examiner

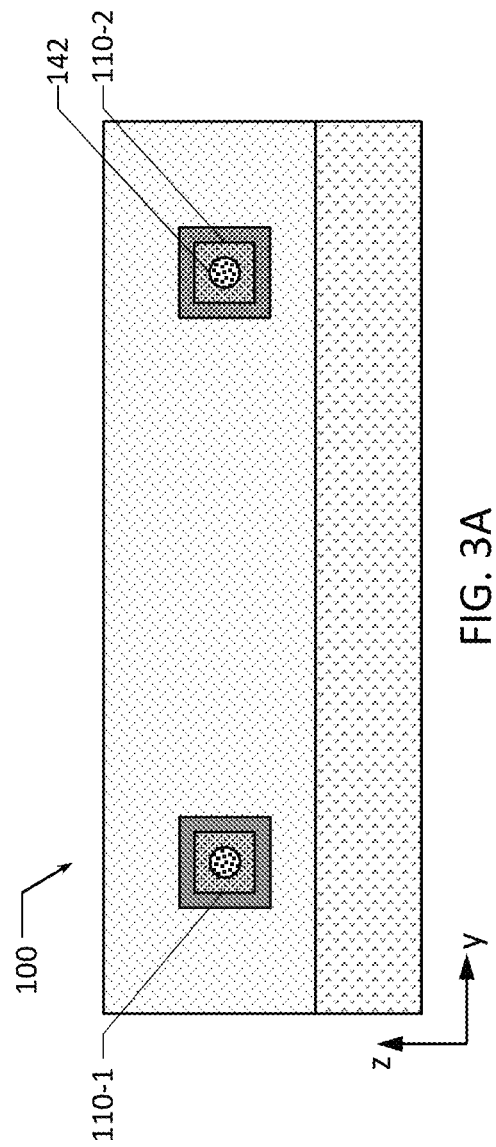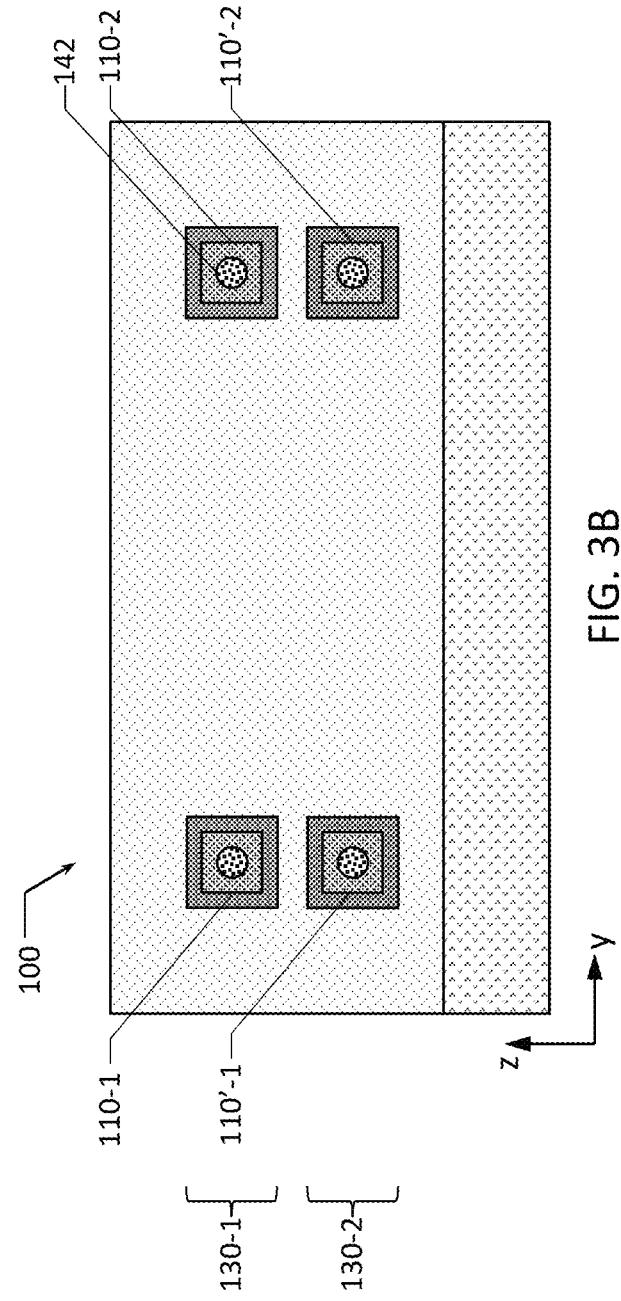

NANORIBBON-BASED QUANTUM DOT DEVICES

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3C are transverse cross-sectional side views of the nanoribbon-based quantum dot device of FIG. 1, according to different embodiments.

DETAILED DESCRIPTION

Figure 1:
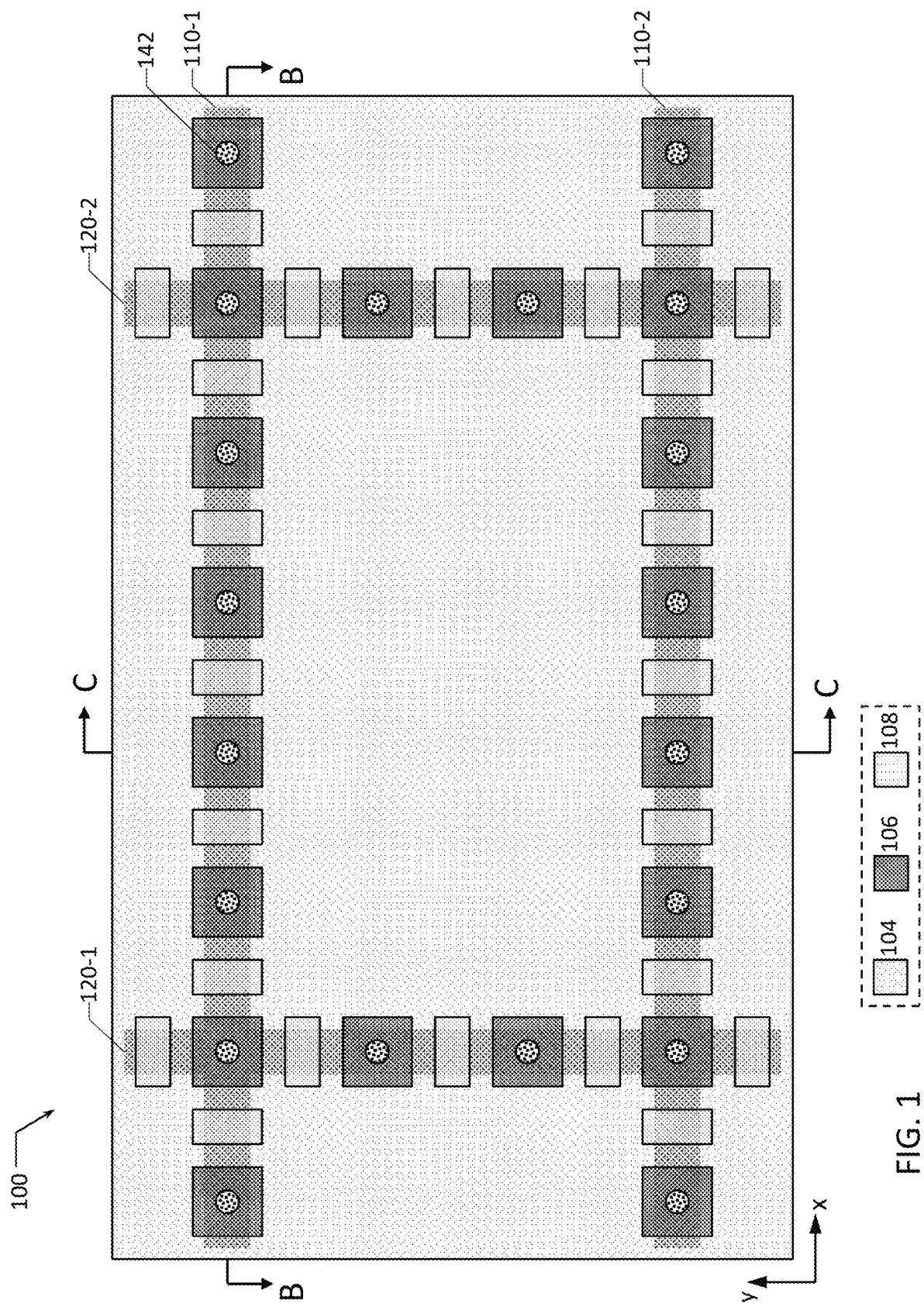
FIG. 1 is a top-down view of an example nanoribbon-based quantum dot device, according to some embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating nanoribbon-based quantum dot devices, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of $2^N$ quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc. Devices that rely on formation of quantum dots (referred to herein as "quantum dot devices"), e.g., spin qubit devices, are particularly promising for large-scale qubit implementation.

In general, quantum dot devices enable formation of quantum dots to serve as quantum bits (i.e., as qubits, e.g., as spin qubits) in a quantum computing device, as well as the control of these quantum dots to perform quantum logic operations. To that end, quantum dot devices implement multiple terminals, such as gate terminals of various types of gates (e.g., barrier gates, plunger gates, and accumulation gates) as well as terminals for making electrical contact with doped regions of a semiconductor material (which may be referred to as "source terminals" and "drain terminals"). DC bias control signals and AC pulses applied to various terminals may be used to control formation of quantum dots in such devices. Read devices such as single electron transistor (SET) detectors, provided proximate to quantum dot qubits, may then be used to detect states of various qubits. So far, only linear quantum dot arrays and small 2×2 quantum dot arrays relying on nearest neighbor interactions have been demonstrated. Oftentimes, such conventional implementations provide limited control of the electrostatic landscape surrounding the quantum dots due to crystal and charge defects, local strain fields, and other peculiarities in the materials in which quantum dots are to be formed, or in the surrounding materials. In addition, imperfections in these materials decrease coherence times of the qubits, compromising the feasibility of using quantum dot arrays for quantum computing applications. Embodiments of the present disclosure provide quantum dot devices and related methods and systems that use semiconductor nanoribbons arranged in a grid where a plurality of first nanoribbons, substantially parallel to one another, intersect a plurality of second nanoribbons, also substantially parallel to one another but at an angle with respect to the first nanoribbons. Different gates at least partially wrap around individual portions of the first and second nanoribbons, and at least some of the gates are provided at intersections of the first and second nanoribbons. Such gates are drastically different from conventional quantum dot devices where only planar gate electrodes on top of a semiconductor material stack are employed. Compared to conventional planar gate implementations, gates that at least partially wrap around portions of the first and/or second nanoribbons allow increased control of the electrostatic landscape of quantum dots due to the larger areas of the gates. In some embodiments, alternating gate geometries may be implemented in nanoribbon-based quantum dot devices, which enables formation of quantum dots with controllable electrostatic barrier heights between them, thereby controlling/modulating the interaction between different quantum dots. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In various embodiments, nanoribbon-based quantum dot devices as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular to, from, and between various gates, conductive vias, and conductive lines described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2J, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of nanoribbon-based quantum dot devices as described herein.

In the following detailed description, various aspects of the illustrative implementations will be described using terms commonly employed by those skilled in the art to convey the substance of their work to others skilled in the art.

For example, a term "interconnect" may be used to describe any interconnect structure formed of an electrically conductive material for providing electrical connectivity to one or more components associated with an IC or/and between various such components. In general, the term "interconnect" may refer to both conductive lines (or, simply, "lines," also sometimes referred to as "traces" or "trenches") and conductive vias (or, simply, "vias"). In general, in context of interconnects, the term "conductive line" may be used to describe an electrically conductive element isolated by an insulator material (e.g., a low-k dielectric material) that is provided within the plane of an IC die (e.g., a support structure). Such conductive lines may be stacked into several levels, or several layers, of a metallization stack. On the other hand, the term "conductive via" may be used to describe an electrically conductive element that interconnects two or more conductive lines of different levels. To that end, a conductive via may be provided substantially perpendicularly to the plane of an IC die and may interconnect two conductive lines in adjacent levels or two conductive lines in not adjacent levels. A term "metallization stack" may be used to refer to a stack of one or more interconnects for providing connectivity to different circuit components of an IC chip. Sometimes, conductive lines and vias may be referred to as "metal lines" and "metal vias", respectively, to highlight the fact that these elements include electrically conductive materials such as metals.

In another example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% (e.g., within +/−10% or within +/−2%) of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% (e.g., within +/−2-10%) of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Figure 2A:
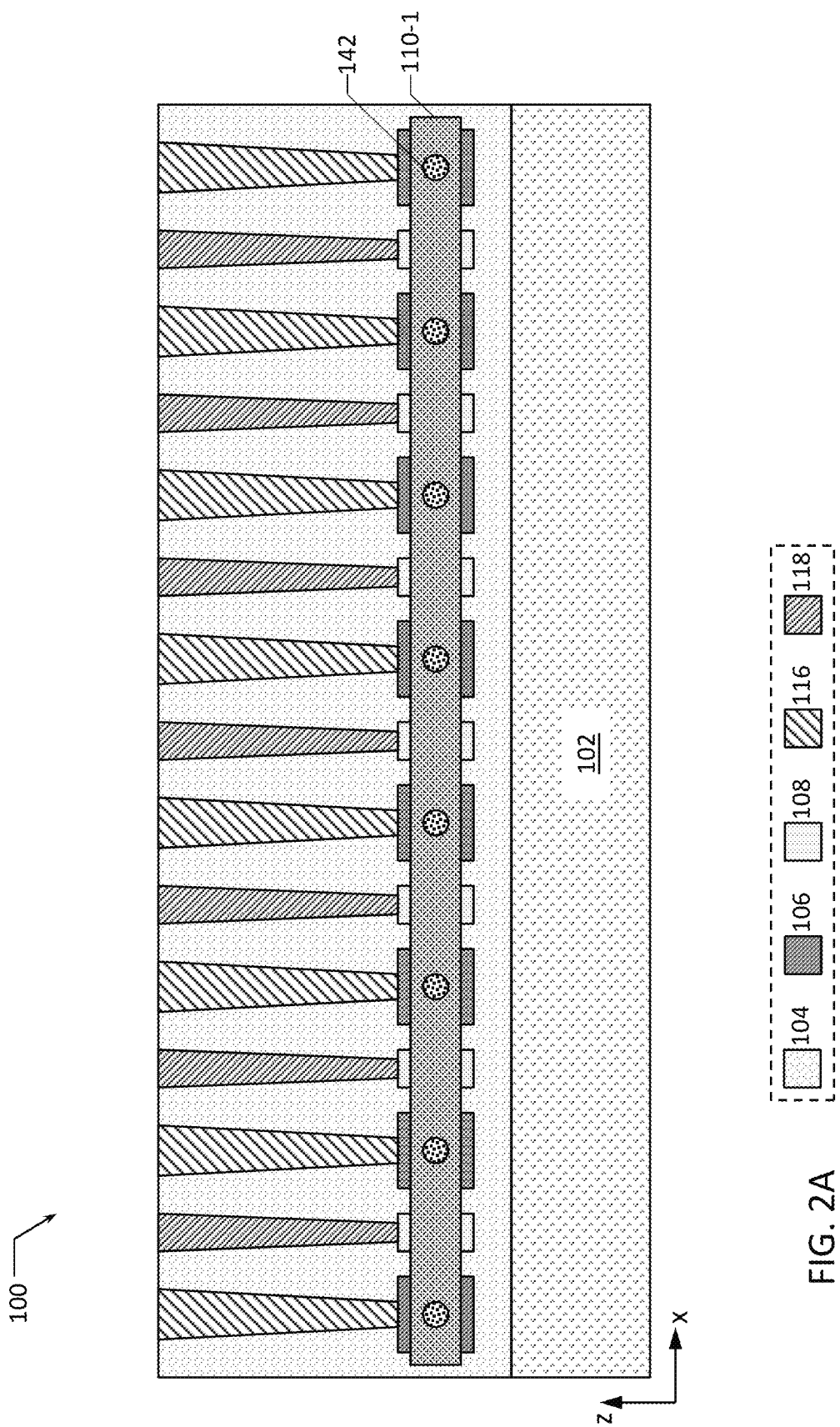
FIGS. 2A-2J are longitudinal cross-sectional side views of the nanoribbon-based quantum dot device of FIG. 1, according to different embodiments.
Figure 2B:
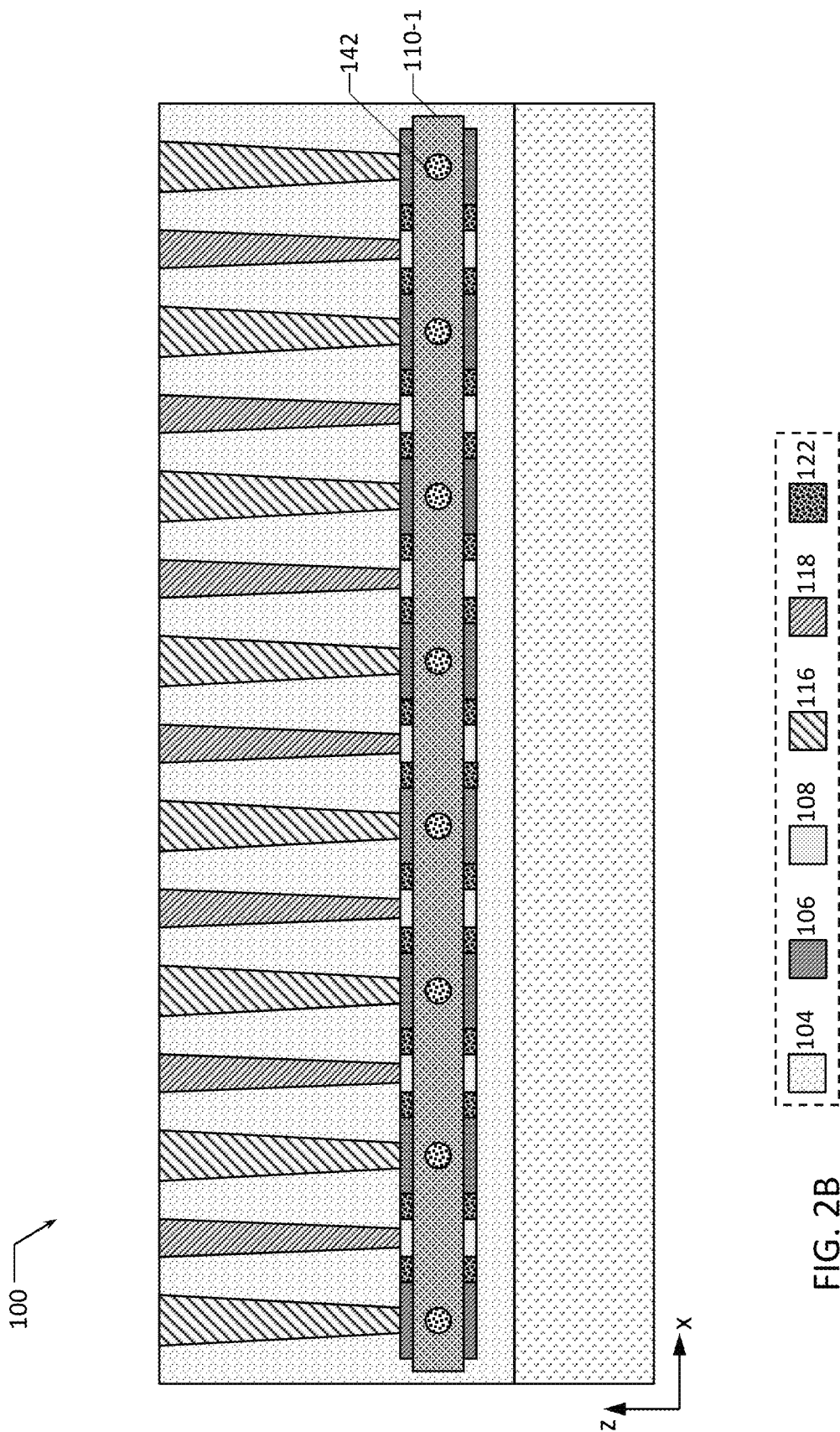
Figure 2C:
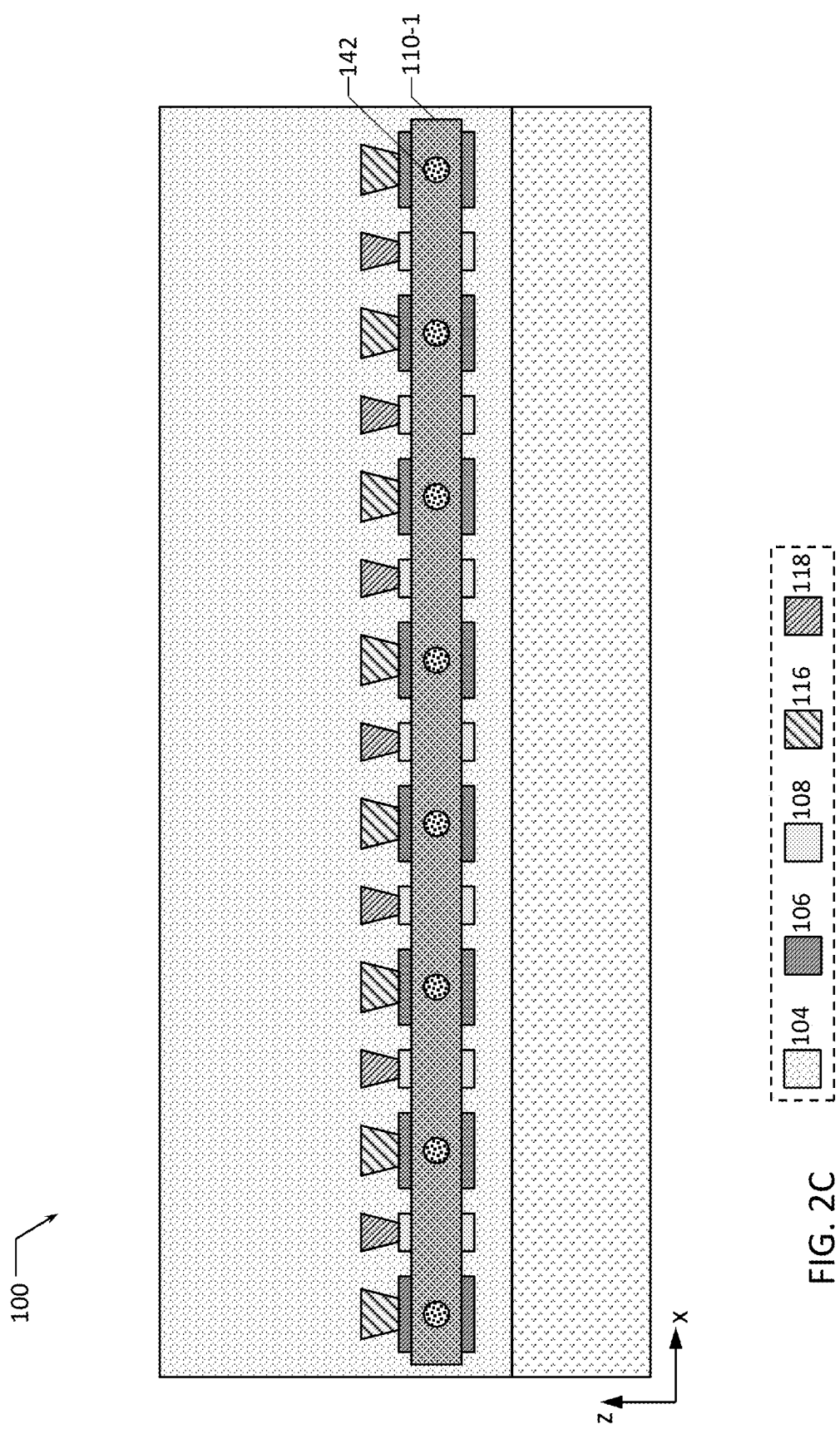
Figure 2D:
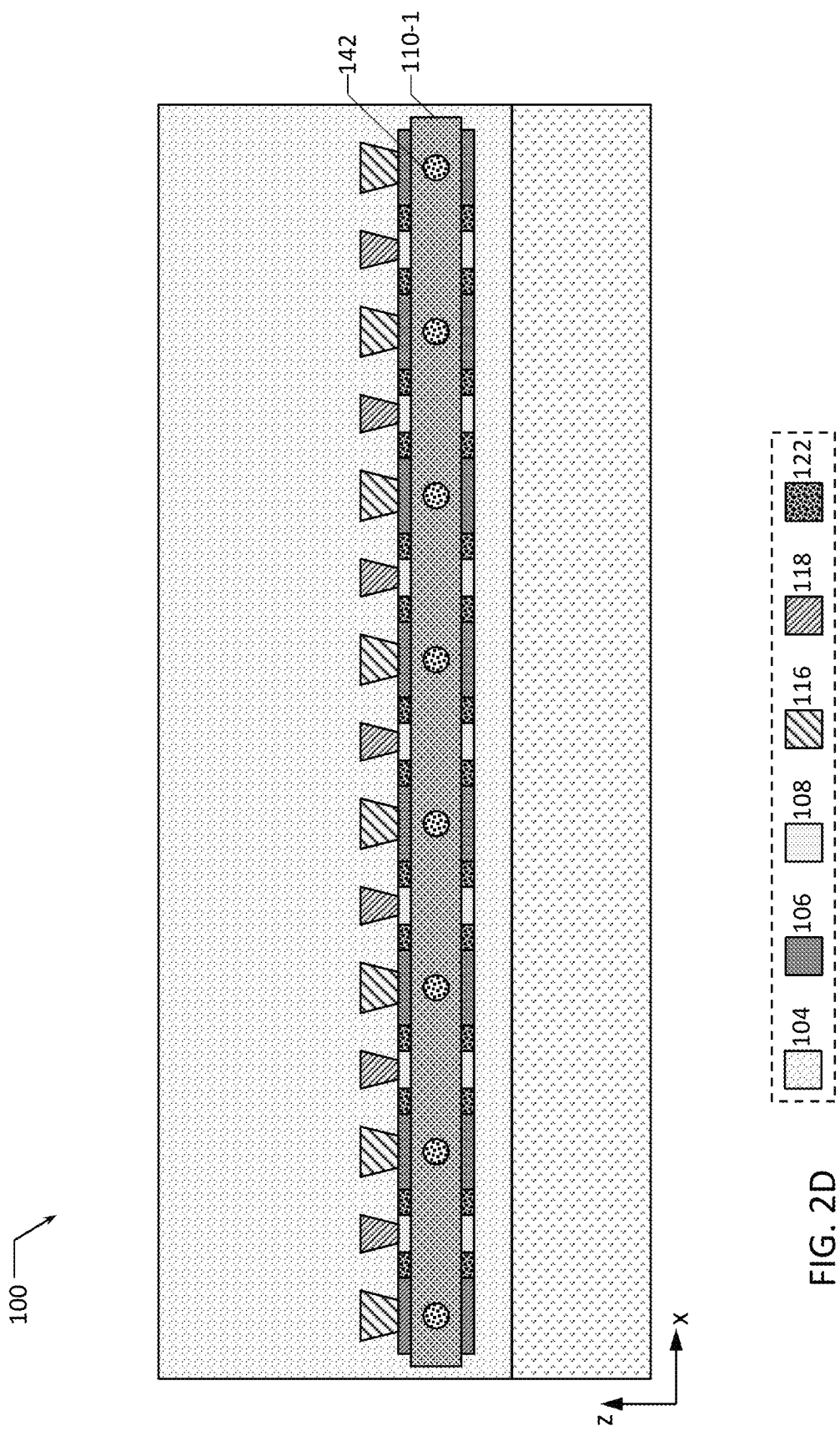
Figure 2E:
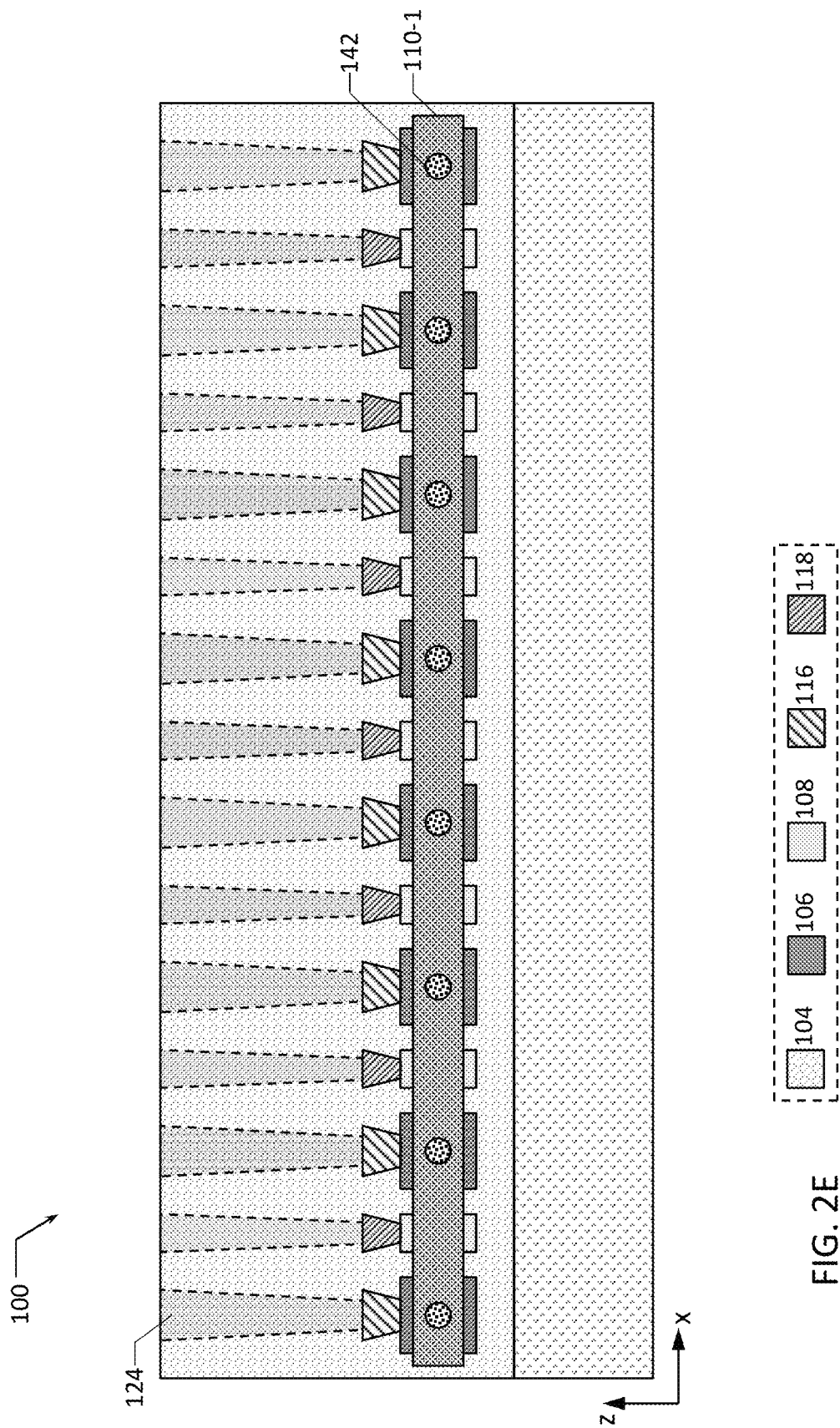
Figure 2F:
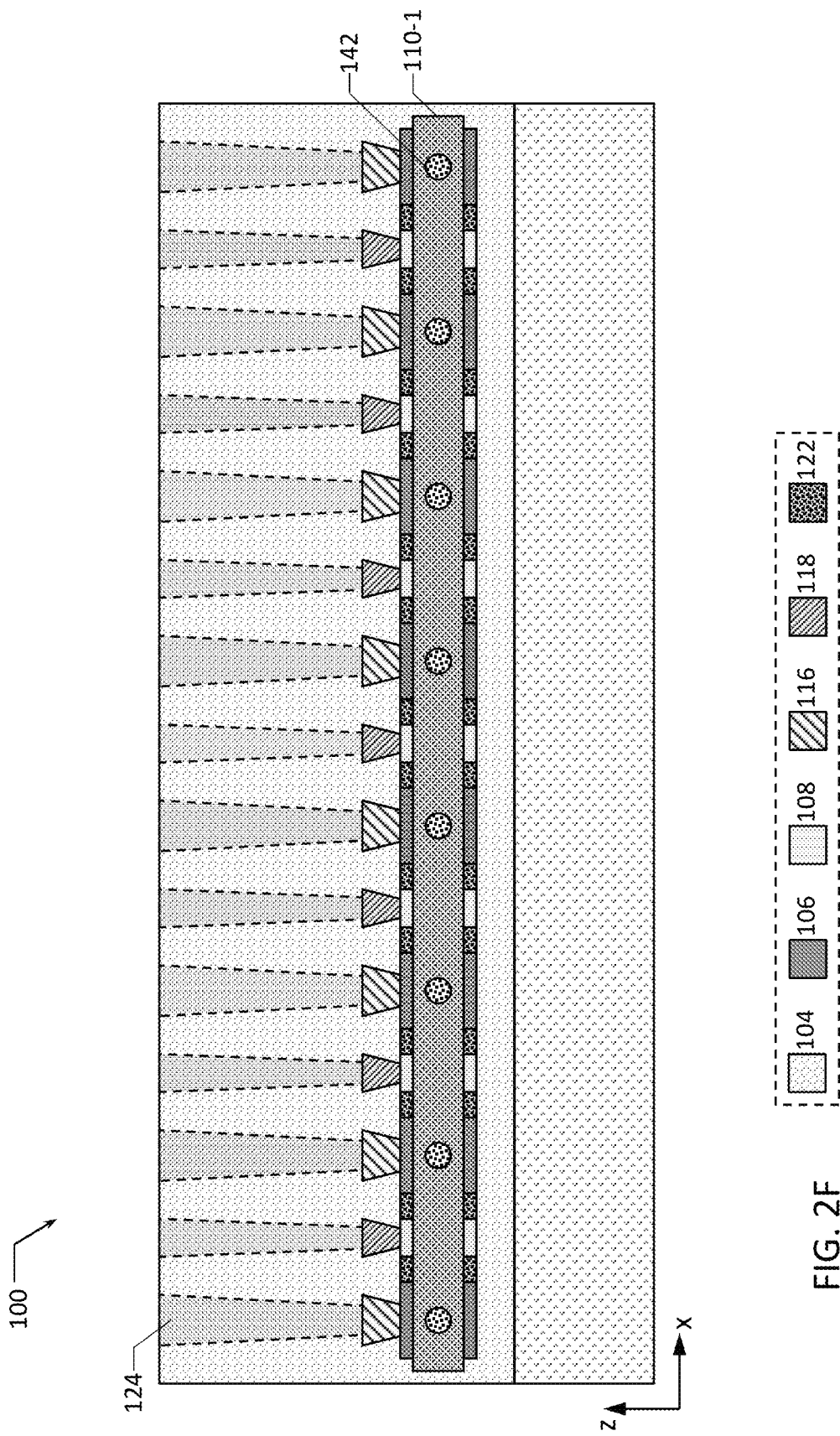
Figure 2G:
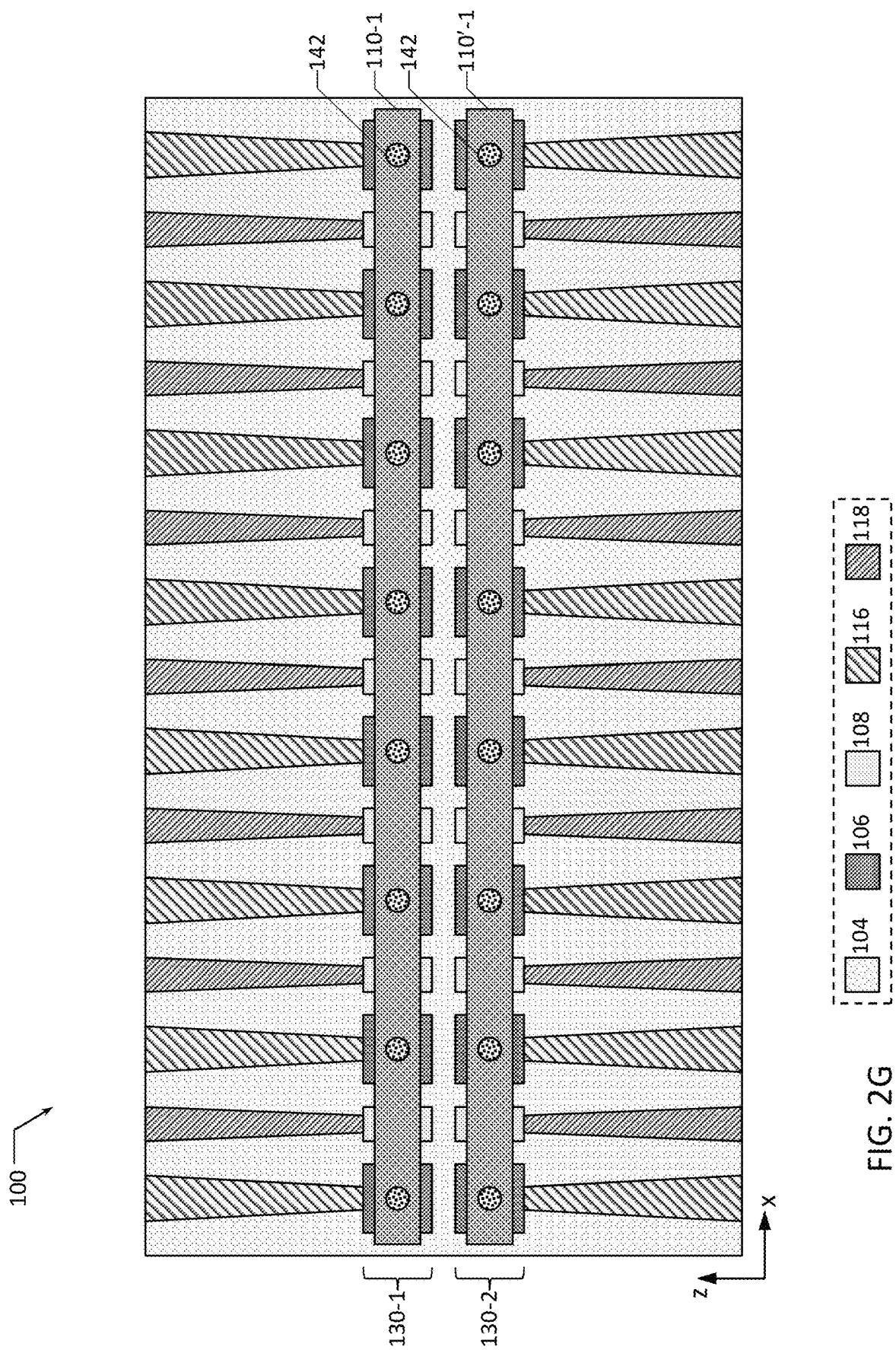
Figure 2H:
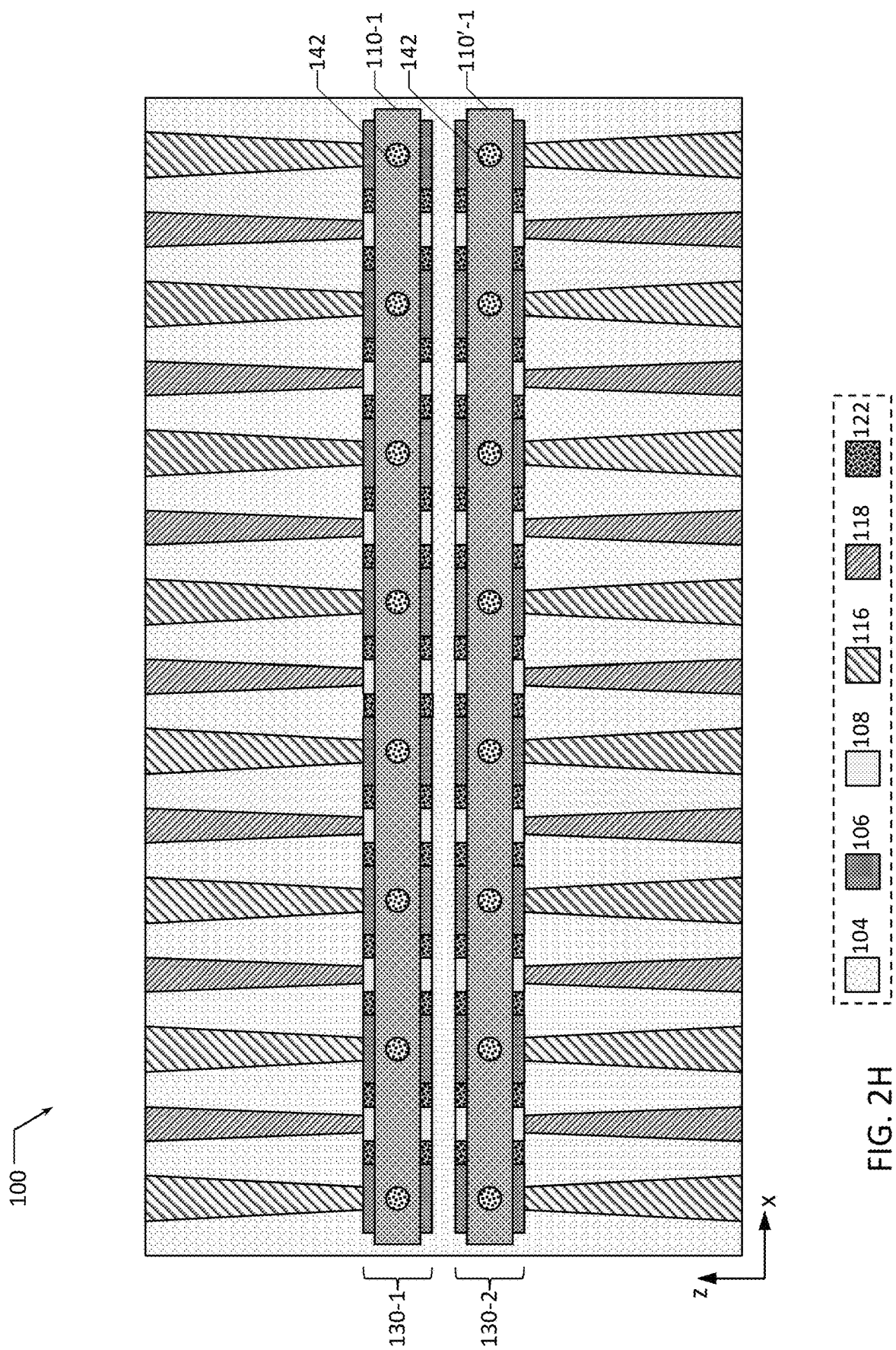
Figure 2I:
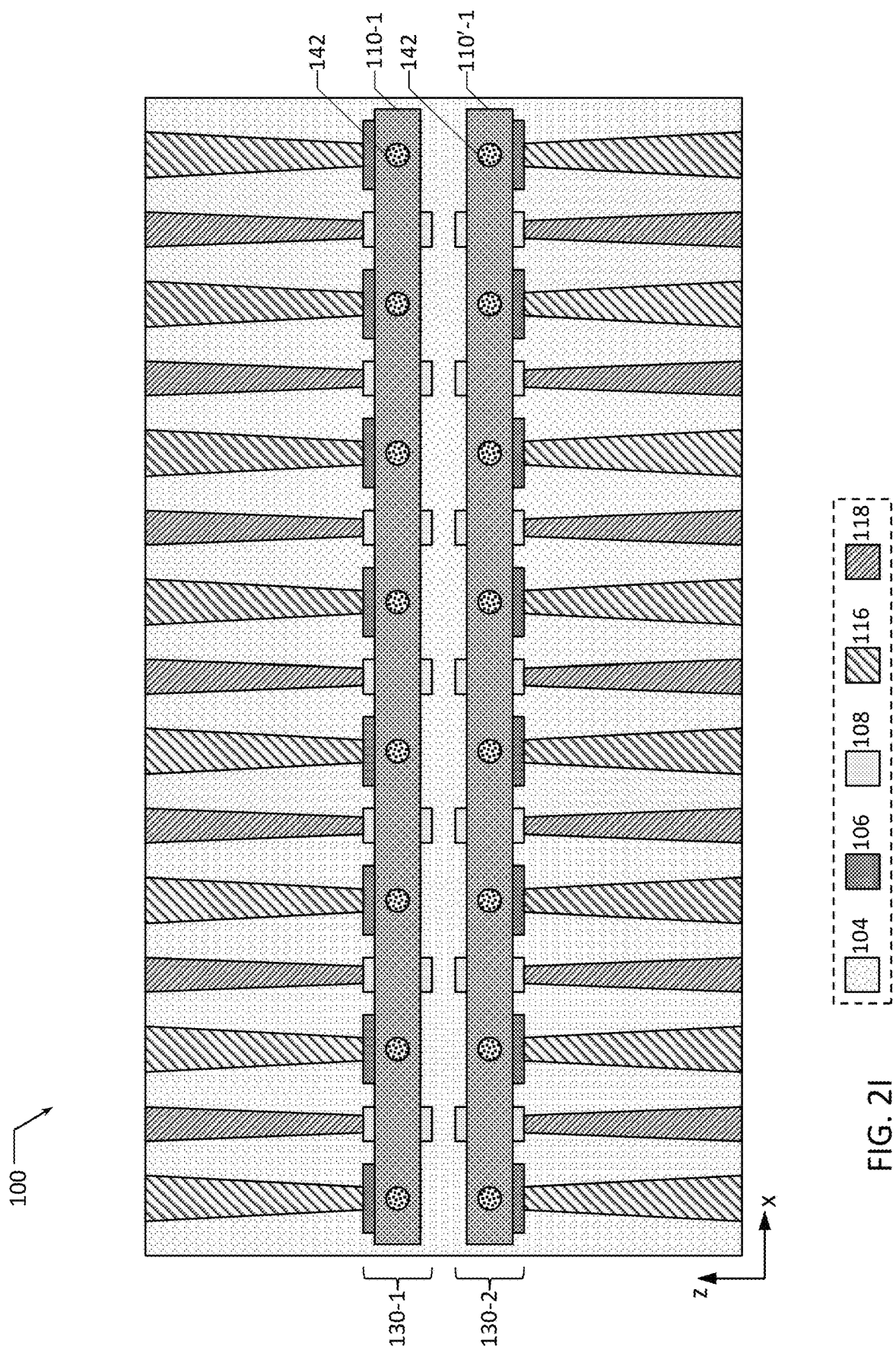
Figure 2J:
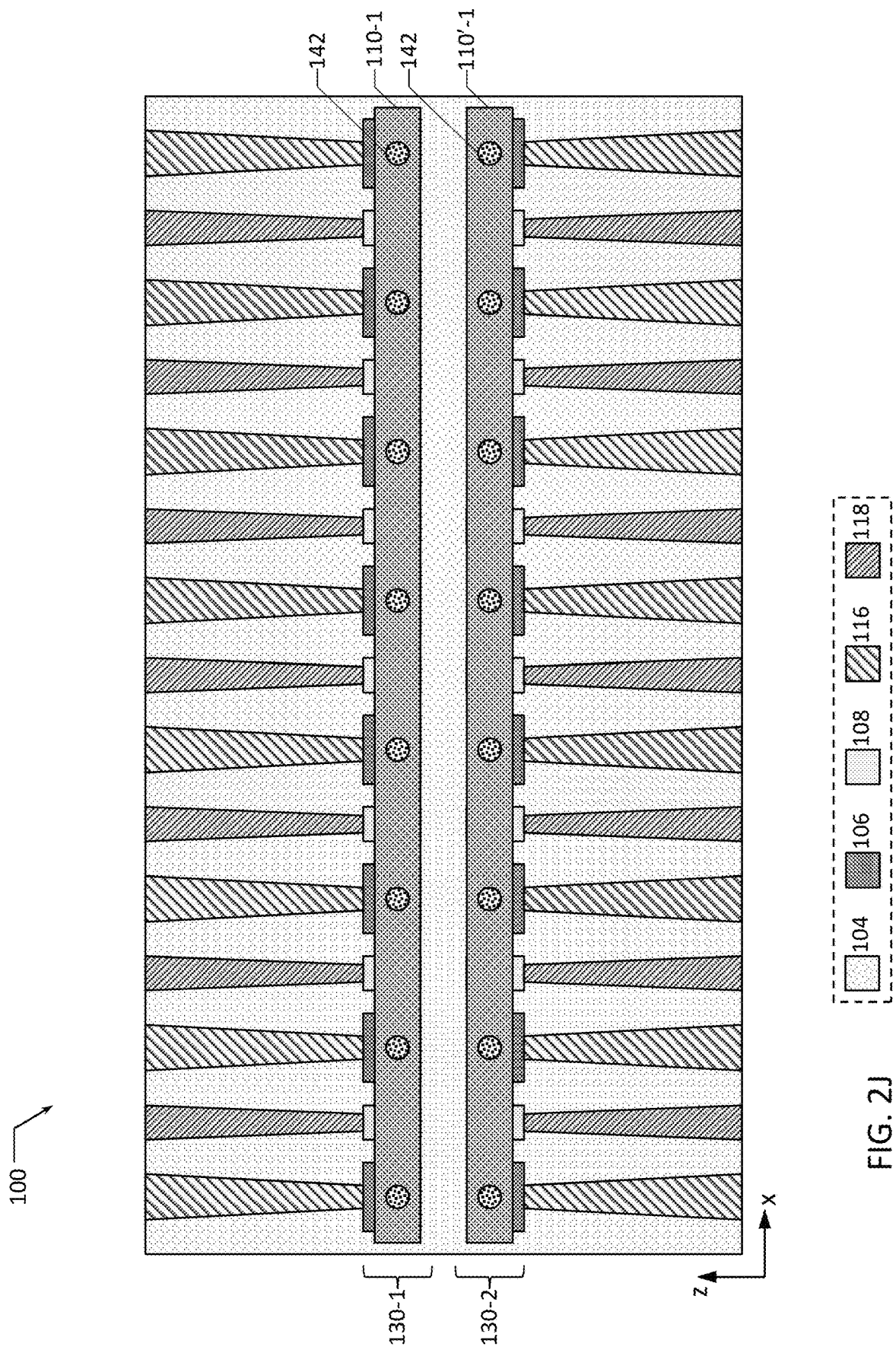
Figure 3C:
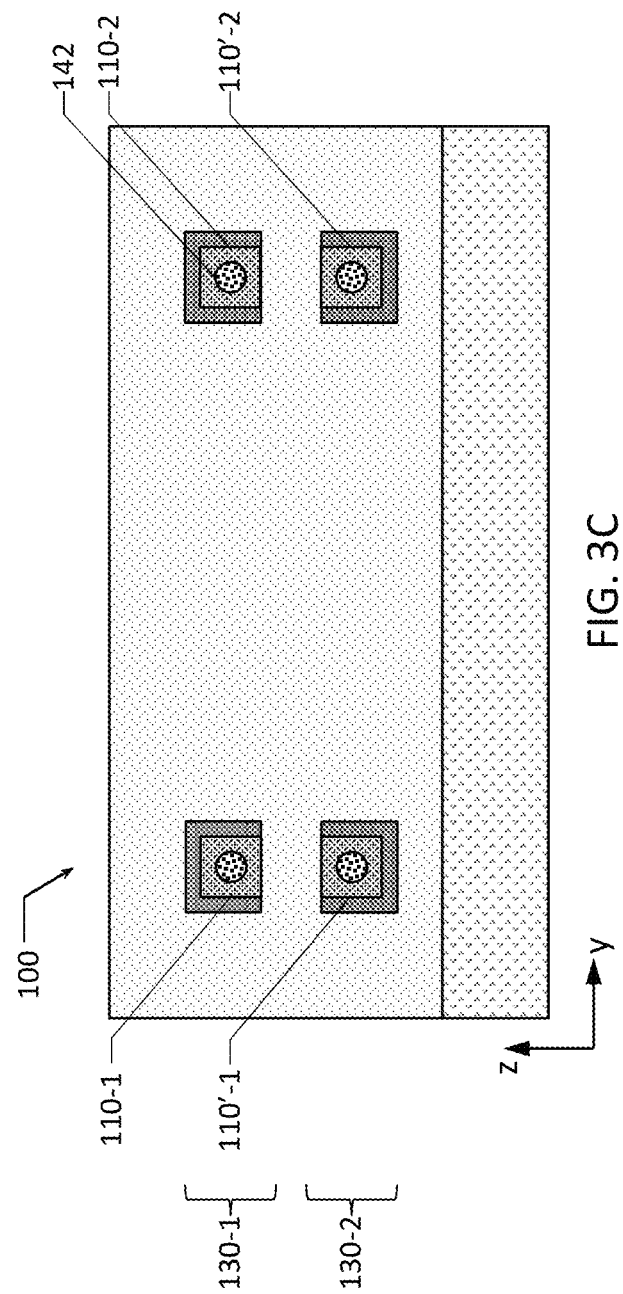

FIG. 1 is a top-down view of an example nanoribbon-based quantum dot device 100 according to some embodiments of the present disclosure, while FIGS. 2A-2J are longitudinal cross-sectional side views of the nanoribbon-based quantum dot device 100 and FIGS. 3A-3C are transverse cross-sectional side views of the nanoribbon-based quantum dot device 100 according to different embodiments. In particular, each of FIGS. 2A-2J illustrates a cross-section of the quantum dot device 100 taken along the section/plane B-B of FIG. 1, while each of FIGS. 3A-3C illustrates a cross-section of the quantum dot device 100 taken along the section/plane C-C of FIG. 1. With reference to an example coordinate system x-y-z, shown in the present drawings, that may be used to provide different views of the quantum dot device 100, FIG. 1 provides a top-down view of an x-y plane, each of FIGS. 2A-2J provides a cross-sectional side view across an x-z plane according to one of a plurality of embodiments, and each of FIGS. 3A-3C provides a cross-sectional side view across a y-z plane according to one of a plurality of embodiments, with a number of components not shown in FIGS. 1-3 to more readily illustrate the details of the nanoribbon-based quantum dot device 100. A number of elements referred to in the description of FIGS. 1-3 with reference numerals are illustrated in FIGS. 1-3 with different patterns in order to not clutter the drawings with too many reference numerals, with a legend showing the correspondence between the reference numerals and patterns being provided at the bottom of FIGS. 1-3. For example, the legend illustrates that FIGS. 1-3 use different patterns to show an insulating material 104, quantum dot gates 106, quantum dot gates 108, etc. Unless specified otherwise, descriptions of the quantum dot device 100 provided below refer to all embodiments shown in FIGS. 1-3.

As shown in FIGS. 1-3, the quantum dot device 100 may include a plurality of first nanoribbons 110 which are substantially parallel to one another, and further include a plurality of second nanoribbons 120 which are substantially parallel to one another but intersect the first nanoribbons 110, thus forming a two-dimensional (2D) grid of nanoribbons. A grid of the first nanoribbons 110 and the second nanoribbons 120 may be provided above a support structure 102, defining a single layer, or a two-dimensional array, of nanoribbons, where portions of the first nanoribbons 110 and the second nanoribbons 120 may be surrounded by an insulating material 104. Multiple such grids may be stacked above one another in some embodiments, thus forming a three-dimensional (3D) stack of grids of nanoribbons.

Examples of this are shown in FIGS. 2G-2I, illustrating that two layers of nanoribbons 110, 120 may be provided above one another above the support structure 102.

The support structure 102 may, e.g., be the wafer 1100 of FIG. 11, discussed below, and may be, or be included in, a die, e.g., the singulated die 1102 of FIG. 11, discussed below. The support structure 102 may be a semiconductor substrate composed of semiconductor material systems including, for example, n-type or p-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a sapphire substrate. In some embodiments, the support structure 102 may be a printed circuit board (PCB) substrate. Although a few examples of materials from which the support structure 102 may be formed are described here, any material that may serve as a foundation upon which a nanoribbon-based quantum dot device as described herein may be built falls within the spirit and scope of the present disclosure.

The insulating material 104 may be a dielectric material (e.g., an interlayer dielectric). In some embodiments, the insulating material 104 may be a chemical vapor deposition (CVD) or flowable CVD oxide. In other embodiments, the insulating material 104 may include low-k dielectric materials such as silicon oxide, carbon-doped oxide, silicon nitride, organic polymers such as perfluorocyclobutane or polytetrafluoroethylene, fused silica glass (FSG), and organosilicates such as silsesquioxane, siloxane, or organo-silicate glass. In other embodiments, the insulating material 104 may include high-k dielectric materials including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

As used herein, the term "nanoribbon" refers to an elongated structure of a semiconductor material having a longitudinal axis parallel to a support structure (e.g., a substrate, a die, a chip, or a wafer) over which such a structure is provided, e.g., the support structure 102. Typically, a length of a nanoribbon (i.e., a dimension measured along the longitudinal axis, e.g., for the nanoribbons 110, such a dimension is shown in the present drawings to be along the x-axis of the example coordinate system shown) is greater than each of a width (i.e., a dimension measured in a transverse cross-section along the nanoribbon, substantially parallel to the support structure 102, e.g., for the nanoribbons 110, such a dimension is measured along the y-axis of the example coordinate system shown in the present drawings) and a thickness/height (i.e., a dimension measured in a transverse cross-section along the nanoribbon, substantially perpendicular to the support structure 102, e.g., for the nanoribbons 110 as well as the nanoribbons 120, such a dimension is measured along the z-axis of the example coordinate system shown in the present drawings). In some settings, the terms "nanoribbon" or "nanosheet" have been used to describe elongated semiconductor structures that have a rectangular transverse cross-section (i.e., a cross-section in a plane perpendicular to the longitudinal axis of the structure), while the term "nanowire" has been used to describe similar elongated structures but with circular transverse cross-sections. In the present disclosure, the term "nanoribbon" is used to refer to all such nanowires, nanoribbons, and nanosheets, as well as elongated semiconductor structures with a longitudinal axis parallel to the support structures and with having transverse cross-sections of any geometry (e.g., transverse cross-sections in the shape of an oval or a polygon with rounded corners). A quantum dot device may then be described as a "nanoribbon-based quantum dot device" if a region in which one or more quantum dots form during operation of the device (i.e., a quantum dot formation region) is a portion of a nanoribbon, i.e., a portion around which a gate of a quantum dot device may wrap around. As used herein, the term "width" of a nanoribbon refers to a dimension of the nanoribbon measured in a plane that is perpendicular to the longitudinal axis of the nanoribbon in a direction parallel to the support structure 102, the term "thickness" of a nanoribbon refers to a dimension of the nanoribbon measured in a direction perpendicular to the support structure 102, and the term "length" of a nanoribbon refers to a dimension of the nanoribbon measured in a plane that is parallel to the longitudinal axis of the nanoribbon in a direction parallel to the support structure 102. In various embodiments, any of the nanoribbons discussed herein, e.g., any of the nanoribbons 110 or 120, may have a width between about 10 and 100 nanometers, e.g., between about 10 and 50 nanometers, or between about 15 and 30 nanometers; a thickness between about 5 and 100 nanometers, e.g., between about 10 and 50 nanometers, or between about 15 and 30 nanometers; and a length between about 50 and 1000 nanometers, e.g., between about 100 and 500 nanometers, or between about 150 and 300 nanometers.

Each of the nanoribbons 110, 120 includes a quantum well stack 146 that includes a quantum well layer 152 (not specifically illustrated in FIGS. 1-3 but shown in FIGS. 6-8 and described below), where materials of the quantum well stack 146 and, correspondingly, of the quantum well layer 152, are shaped to form each of the individual ones of the nanoribbons 110, 120. The quantum well layer 152 included in the quantum well stack 146 of the nanoribbons 110, 120 may be arranged normal to the z-direction, and may provide a layer in which a two-dimensional electron gas (2DEG) or a two-dimensional hole gas (2DHG) may form to enable the generation of one or more quantum dots during operation of the quantum dot device 100, as discussed in greater detail below.

Quantum dot devices as described herein, e.g., any embodiment of the quantum dot device 100, enable formation of quantum dots to serve as quantum bits (i.e., as qubits) in a quantum computing device, as well as formation of quantum dots to serve as a part of one or more SETs for reading/detecting states of said qubits. In particular, the quantum dot devices described herein include 2D arrays of quantum dot formation regions, each array formed by a grid of the first nanoribbons 110 intersecting the second nanoribbons 120, where, in some embodiments, multiple such two-dimensional arrays may be stacked above one another in different layers above the support structure 102, resulting in 3D arrays of quantum dot formation regions. For example, quantum dot formation regions of some layers may be regions where quantum dots for serving as qubits are formed, while other quantum dot formation regions of other layers may be regions where quantum dots for serving as a part of one or more SETs are formed.

Various gates may be provided along individual ones of the nanoribbons 110, 120, as well as at intersections of the nanoribbons 110 and 120. A gate provided along an individual one of the nanoribbons 110, 120 may at least partially (in some embodiments—completely) wrap around a portion of the nanoribbon. A gate provided at an intersection of one of the nanoribbons 110 and one of the nanoribbons 120 may include, in various embodiments, one or more of: 1) a portion above the intersection, 2) a portion below the intersection, 3) a portion that at least partially wraps around the intersection. In general, each of the gates of the quantum dot device 100 may include a gate metal and, optionally, also a gate dielectric. In some embodiments, the gate metal of any of the gates of the quantum dot device 100 may be a superconductor, such as aluminum, titanium nitride (e.g., deposited via atomic layer deposition), or niobium titanium nitride. In other embodiments, the gate metal of any of the gates of the quantum dot device 100 may be a non-superconductor, e.g., any of conventional gate metal materials used in semiconductor manufacturing. The gate dielectric of any of the gates of the quantum dot device 100 may be, for example, silicon oxide, aluminum oxide, or a high-k dielectric, such as hafnium oxide. More generally, the gate dielectric of any of the gates of the quantum dot device 100 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric of any of the gates of the quantum dot device 100 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric of any of the gates of the quantum dot device 100 to improve the quality of the gate dielectric.

In some embodiments, the gates of the quantum dot device 100 may include quantum dot gates 106 and quantum dot gates 108, e.g., provided in alternation, as shown in FIGS. 1-3. In some embodiments, the quantum dot gates 106 may be plunger gates, while the quantum dot gates 108 may be barrier gates. In general, the term "plunger gate" refers to a gate that wraps around a portion of a nanoribbon (e.g., either one of the nanoribbons 110 or one of the nanoribbons 120), or a gate that is provided proximate to an intersection of one of the nanoribbons 110 and one of the nanoribbons 120, in which a quantum dot is formed during operation of the quantum dot device 100. FIGS. 1-3 illustrate quantum dots 142 that overlap with the quantum dot gates 106 (only one of the quantum dots 142, shown as a circle overlapping with one of the quantum dot gates 106, is labeled in FIG. 1 with a reference numeral, but other quantum dots 142 represented in the present drawings by analogous circles) to illustrate the embodiment where the quantum dot gates 106 are plunger gates. On the other hand, the term "barrier gate" refers to a gate that is used to control potential barrier between adjacent plunger gates. FIGS. 1-3 illustrate the embodiment where the quantum dot gates 108 are barrier gates, and, therefore, no quantum dots 142 overlap with the quantum dot gates 108 in these drawings. In further embodiments of the quantum dot device 100 as shown in FIGS. 1-3, the quantum dot gates 106 may be barrier gates, while the quantum dot gates 108 may be plunger gates, in which case the quantum dots 142 would be overlapping with the quantum dot gates 108 in these drawings. In general, the quantum dot device 100 may include any number of quantum dot gates 106 and any number of quantum dot gates 108, arranged in any order and in any locations with respect to the nanoribbons 110, 120, not necessarily as shown in the present drawings. In some embodiments, any of the quantum dot gates 106, 108 may be accumulation gates, where the term "accumulation gate" refers to a gate that enables the controlled supply of electrons/holes for population of the quantum dot array.

In the quantum dot device 100, quantum dot formation regions may be defined by the nanoribbons 110, 120 and the quantum dot gates that at least partially wrap around these nanoribbons. For example, for the nanoribbons 110, the quantum dot formations regions in the nanoribbons 110 may be defined in the respective y-z planes by the width of the nanoribbons 110, measured along the y-axis, and the height of the nanoribbons 110, measured along the z-axis, and may be further defined along the x-axis by respective gates 106, 108 provided along an individual nanoribbon 110. In another example, for the nanoribbons 120 of the embodiments shown in FIGS. 1-3, the quantum dot formations regions in the nanoribbons 120 may be defined in the respective x-z planes by the width of the nanoribbons 120, measured along the x-axis, and the height of the nanoribbons 120, measured along the z-axis, and may be further defined along the y-axis by respective gates 106, 108 provided along an individual nanoribbon 120.

The quantum dot devices 100 disclosed herein may be used to form electron-type or hole-type quantum dots 142. Note that the polarity of the voltages applied to the quantum dot gates 106, 108 of the quantum dot device 100 to form quantum wells/barriers depends on the charge carriers used in the quantum dot device 100. In embodiments in which the charge carriers are electrons (and thus the quantum dots are electron-type quantum dots), amply negative voltages applied to a quantum dot gate may increase the potential barrier under the gate, and amply positive voltages applied to a quantum dot gate may decrease the potential barrier under the gate (thereby forming a potential well in which an electron-type quantum dot may form). In embodiments in which the charge carriers are holes (and thus the quantum dots are hole-type quantum dots), amply positive voltages applied to a quantum dot gate may increase the potential barrier under the gate, and amply negative voltages applied to a quantum dot gate may decrease the potential barrier under the gate (thereby forming a potential well in which a hole-type quantum dot may form). The quantum dot devices 100 disclosed herein may be used to form electron-type or hole-type quantum dots.

Voltages may be applied to each of the quantum dot gates separately to adjust the potential energy in the quantum well stack 146 surrounded by the quantum dot gates 106, 108, and thereby control the formation of quantum dots under individual ones of the quantum dot gates. Additionally, the relative potential energy profiles under different ones of the quantum dot gates 106, 108 allow the quantum dot device 100 to tune the potential interaction between quantum dots under adjacent gates. For example, if two adjacent quantum dots (e.g., one quantum dot under one quantum dot gate and another quantum dot under an adjacent quantum dot gate) are separated by only a short potential barrier, the two quantum dots may interact more strongly than if they were separated by a taller potential barrier. Since the depth of the potential wells/height of the potential barriers under each quantum dot gate may be adjusted by adjusting the voltages on the respective gates, the differences in potential between adjacent quantum dot gate may be adjusted, and thus the interaction tuned. In some applications, some of the quantum dot gates of the quantum dot device 100 may be used as plunger gates (e.g., the quantum dot gates 106) to enable the formation of quantum dots under these gates, while some other ones of the quantum dot gates may be used as barrier gates (e.g., the quantum dot gates 108) to adjust the potential barrier between quantum dots formed under adjacent plunger gates.

Although not specifically shown in the present drawings, the quantum well stack 146 within any of the nanoribbons 110, 120 may include doped regions that may serve as a reservoir of charge carriers for the quantum dot device 100, with an accumulation gate provided over a portion of the quantum well stack 146 between a given doped region and a quantum dot array (or a quantum dot formation region). For example, an n-type doped region may supply electrons for electron-type quantum dots, and a p-type doped region may supply holes for hole-type quantum dots. In some embodiments, an interface material may be disposed at a surface of a doped region. The interface material may facilitate electrical coupling between a conductive contact (e.g., a conductive via, as discussed herein) and the doped region. The interface material may be any suitable metal-semiconductor ohmic contact material; for example, in embodiments in which the doped region includes silicon, the interface material may include nickel silicide, aluminum silicide, titanium silicide, molybdenum silicide, cobalt silicide, tungsten silicide, or platinum silicide. In some embodiments, the interface material may be a non-silicide compound, such as titanium nitride. In some embodiments, the interface material may be a metal (e.g., aluminum, tungsten, or indium).

During operation, a bias voltage may be applied to the doped regions (e.g., via the conductive vias and the interface material) to cause current to flow through the doped regions and through a quantum well layer of the quantum well stack 146 (discussed in further detail below with reference to FIGS. 6-8). When the doped regions are doped with an n-type material, this voltage may be positive; when the doped regions are doped with a p-type material, this voltage may be negative. The magnitude of this bias voltage may take any suitable value (e.g., between about 0.25 volts and 2 volts).

In various embodiments, conductive interconnects 116, 118 (e.g., conductive vias and lines) may make contact with the individual ones of the quantum dot gates 106, 108, to enable electrical connection to the quantum dot gates 106, 108 to be made in desired locations. As shown in FIGS. 1-3, individual ones of the conductive interconnects 116 make contact with the individual ones of the quantum dot gates 106, while individual ones of the conductive interconnects 118 make contact with the individual ones of the quantum dot gates 108. Although not specifically shown in the present drawings, similar conductive contacts may make contact to the doped regions of the quantum dot device 100, to enable electrical connection to the doped regions to be made in desired locations. The conductive interconnects 116, 118 included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

Each of FIG. 2A and FIG. 2B illustrates an embodiment where the conductive interconnects 116, 118 are conductive vias that extend through the insulating material 104 to make contact with the individual ones of the quantum dot gates 106, 108. The difference between FIGS. 2A and 2B is in that, in the quantum dot device 100 of FIG. 2B, a spacer material 122 is used to separate the nearest gates of the quantum dot gates 106, 108 provided along a given nanoribbon, whereas, in the quantum dot device 100 of FIG. 2A, the insulating material 104 is used to separate the nearest gates of the quantum dot gates 106, 108 provided along a given nanoribbon. If used in the quantum dot device 100, the spacer material 122 may include any of the materials described with reference to the insulating material 104 but may have a different material composition than the insulating material 104. In some embodiments when the spacer material 122 is used, the spacer material 122 may be conformal to one or more of quantum dot gates 106, 108.

Each of FIG. 2C and FIG. 2D illustrates an embodiment where the conductive interconnects 116, 118 are conductive lines that extend through the insulating material 104 to make contact with the individual ones of the quantum dot gates 106, 108. Similar to FIGS. 2A and 2B, the difference between FIGS. 2C and 2D is in that, in the quantum dot device 100 of FIG. 2D, the spacer material 122 is used, while, in the quantum dot device 100 of FIG. 2C, the insulating material 104 is used to separate the nearest gates of the quantum dot gates 106, 108 provided along a given nanoribbon.

In various further embodiments, the conductive interconnects 116, 118 may include any combination of conductive lines and vias. For example, each of FIG. 2E and FIG. 2F illustrates an embodiment where the conductive interconnects 116, 118 are conductive lines that extend through the insulating material 104 to make contact with the individual ones of the quantum dot gates 106, 108, but further illustrating conductive vias 124 that, individually, contact different ones of the conductive lines of the conductive interconnects 116, 118 in x-z planes other than the one shown. Only one of such conductive vias 124 is labeled in FIGS. 2E and 2F with a reference numeral, but a plurality of such conductive vias are shown in FIGS. 2E and 2F with dashed contours, illustrating that the conductive vias 124 are in different planes than these drawings. Similar to FIGS. 2A and 2B, the difference between FIGS. 2E and 2F is in that, in the quantum dot device 100 of FIG. 2F, the spacer material 122 is used, while, in the quantum dot device 100 of FIG. 2E, the insulating material 104 is used to separate the nearest gates of the quantum dot gates 106, 108 provided along a given nanoribbon.

As shown in FIG. 1, the quantum dot gates 106, 108 may be provided along each of the nanoribbons 110, 120, where, for each of the nanoribbons 110, 120, a first subset of the quantum dot gates 106, 108 may be provided on one side of an intersection with another one of the nanoribbons 110, 120, and a second subset of the quantum dot gates 106, 108 may be provided on the other side of the intersection. Such an arrangement advantageously allows the quantum dots 142 formed in the gates that are at the intersections of different pairs of the nanoribbons 110, 120 to couple and interact with up to four nearest quantum dots 142 provided in either nanoribbon on either side of the intersection. In some embodiments, a dimension of an individual gate of the quantum dot gates 106, 108 along a longitudinal axis of a nanoribbon along which the gate is provided may be between about 5 and 50 nanometers, including all values and ranges therein, e.g., between about 20 and 40 nanometers, e.g., about 30 nanometers. This dimension may be measured along the x-axis for the quantum dot gates 106, 108 provided along the nanoribbons 110 shown in FIGS. 1-3 and along the y-axis for the quantum dot gates 106, 108 provided along the nanoribbons 120 shown in FIGS. 1-3. In some embodiments, a distance between two nearest gates of the quantum dot gates 106, 108 provided along a given nanoribbon may be between about 1 and 50 nanometers, including all values and ranges therein, e.g., between about 1 and 20 nanometers, between about 1 and 10 nanometers, between about 3 and 7 nanometers, or between about 4 and 6 nanometers. This distance may also be measured along the x-axis for the quantum dot gates 106, 108 provided along the nanoribbons 110 shown in FIGS. 1-3 and along the y-axis for the quantum dot gates 106, 108 provided along the nanoribbons 120 shown in FIGS. 1-3.

FIGS. 2A-2F illustrate cross-sectional side views along the nanoribbon 110-1, but these illustrations are also applicable to the remaining ones of the nanoribbons 110 of the quantum dot device 100, as well as for each of the nanoribbons 120. While each of FIGS. 2A-2F illustrates a single layer of a grid of the nanoribbons 110, 120 crossing one another, in other embodiments, multiple such layers may be provided above the support structure 102. FIGS. 2G-2J illustrate embodiments where two grids 130 of the nanoribbons 110, 120 are stacked above one another above the support structure 102. In particular, FIGS. 2G-2J illustrate the nanoribbon 110-1 which may be implemented according to any embodiments described with reference to FIGS. 2A-2F and be a part of a grid 130-1, and further illustrate a nanoribbon 110'-1 which may be provided between the nanoribbon 110-1 and the support structure 102. The nanoribbon 110' may be implemented analogous to the nanoribbons 110, described herein, except in a grid 130-2 that is closer to the support structure 102 than the grid 130-1. Although not specifically shown in the cross-sectional illustrations of FIGS. 2A-2J, the nanoribbons 110' may cross/intersects nanoribbons 120', each of which may be implemented analogous to the nanoribbons 120, described herein, except in the grid 130-2 that is closer to the support structure 102 than the grid 130-1.

As shown in FIGS. 2G-2J, in some embodiments, the grids 130 may be stacked over one another so that their respective plunger gates of the quantum dot gates 106, 108 may be stacked above one another. Such an arrangement of the two grids 130 may be particularly useful when the quantum dots 142 formed in one of the grids 130 are active quantum dots used to perform quantum computing operations, while the quantum dots 142 formed in the other one of the grids 130 are read quantum dots used to sense quantum states (e.g., spin states) of the active quantum dots 142 in the first grid. However, in other embodiments of the quantum dot device 100 with two or more grids 130, plunger gates of different grids 130 do not have to be stacked above one another, and, in general, any of the quantum dots 142 formed in one of the grids 130 may be used to sense the quantum state or one or more of the quantum dots formed in the other one of the grids 130. For example, in various embodiments, during operation of the quantum dot device 100, applying one or more voltages to any one or more of the gates 106, 108 wrapping around the nanoribbons 110, the nanoribbons 120, or at the intersections of the nanoribbons 110 and 120 in the first grid 130-1 causes a first quantum dot to form in the quantum well layer of one of the nanoribbons in the first grid 130-1, and, similarly, applying one or more voltages to any one or more of the gates 106, 108 wrapping around the nanoribbons 110', the nanoribbons 120', or at the intersections of the nanoribbons 110' and 120' in the second grid 130-2 causes a second quantum dot to form in the quantum well layer of one of the nanoribbons in the second grid 130-2. In such embodiments, the operation of the quantum dot device 100 may further include sensing a quantum state of the first quantum dot with the second quantum dot, or, more generally, sensing a quantum state of one or more of the quantum dots 142 in the first grid 130-1 with one or more of the quantum dots 142 in the second grid 130-2.

Each of FIG. 2G and FIG. 2H illustrates an embodiment where the conductive interconnects 116, 118 are conductive vias that extend through the insulating material 104 to make contact with the individual ones of the quantum dot gates 106, 108 in the first grid 130-1 and analogous conductive vias that extend through the insulating material 104 to make contact with the individual ones of the quantum dot gates 106, 108 in the second grid 130-2. Similar to FIGS. 2A and 2B, the difference between FIGS. 2G and 2H is in that, in the quantum dot device 100 of FIG. 2H, the spacer material 122 is used, while, in the quantum dot device 100 of FIG. 2G, the insulating material 104 is used to separate the nearest gates of the quantum dot gates 106, 108 provided along a given nanoribbon.

FIG. 2I illustrates an embodiment that is similar to that shown in FIG. 2G, except that it shows that, in some embodiments, the quantum dot gates 106 do not wrap around the respective nanoribbons 110, 120 completely but, rather, are absent from the bottom faces of the nanoribbons 110, 120 of the top grid 130-1 and from the top faces of the nanoribbons 110, 120 of the bottom grid 130-2. As used herein, the term "bottom face" refers to the faces of the nanoribbons 110,120 that are substantially parallel to the support structure 102 and are closer to the support structure than the opposing faces of the nanoribbons 110, 120, the opposing faces referred to as "top faces" of the nanoribbons. Not having the gate metal of the quantum dot gates 106 in between the adjacent grids 130-1 and 130-2 (i.e., not having the gate metal at the bottom faces of the nanoribbons 110, 120 of the top grid 130-1 and at the top faces of the nanoribbons 110, 120 of the bottom grid 130-2) may be advantageous if reduction in electromagnetic screening that such gate portions may otherwise provide in the quantum dot device 100 is desired.

FIG. 2J illustrates an embodiment that is similar to that shown in FIG. 2I, except that it shows that, in some embodiments, the quantum dot gates 108 may also not wrap around the respective nanoribbons 110, 120 completely but, rather, are absent from the bottom faces of the nanoribbons 110, 120 of the top grid 130-1 and from the top faces of the nanoribbons 110, 120 of the bottom grid 130-2. Not having the gate metal of the quantum dot gates 108 in between the adjacent grids 130-1 and 130-2 (i.e., not having the gate metal at the bottom faces of the nanoribbons 110, 120 of the top grid 130-1 and at the top faces of the nanoribbons 110, 120 of the bottom grid 130-2) may be advantageous if reduction in electromagnetic screening that such gate portions may otherwise provide in the quantum dot device 100 is desired.

FIGS. 3A-3C illustrate transverse cross-sectional side views of the nanoribbons 110 of the quantum dot device 100 (the transverse cross-sections of the nanoribbons 120 would be analogous). In particular, FIG. 3A illustrates a transverse cross-section of the quantum dot device 100 with a single layer of intersecting nanoribbons 110, 120, i.e., the embodiment of any of FIGS. 2A-2F; FIG. 3B illustrates a transverse cross-section of the quantum dot device 100 with two layers of intersecting nanoribbons 110, 120 (i.e., two grids 130-1 and 130-2) with gate metals of the quantum dot gates 106 present in between the grids 130, i.e., the embodiment of any of FIGS. 2G-2H; and FIG. 3C illustrates a transverse cross-section of the quantum dot device 100 with two layers of intersecting nanoribbons 110, 120 (i.e., two grids 130-1 and 130-2) with gate metals of the quantum dot gates 106 absent in between the grids 130, i.e., the embodiment of any of FIGS. 2I-2J.

Figure 4:
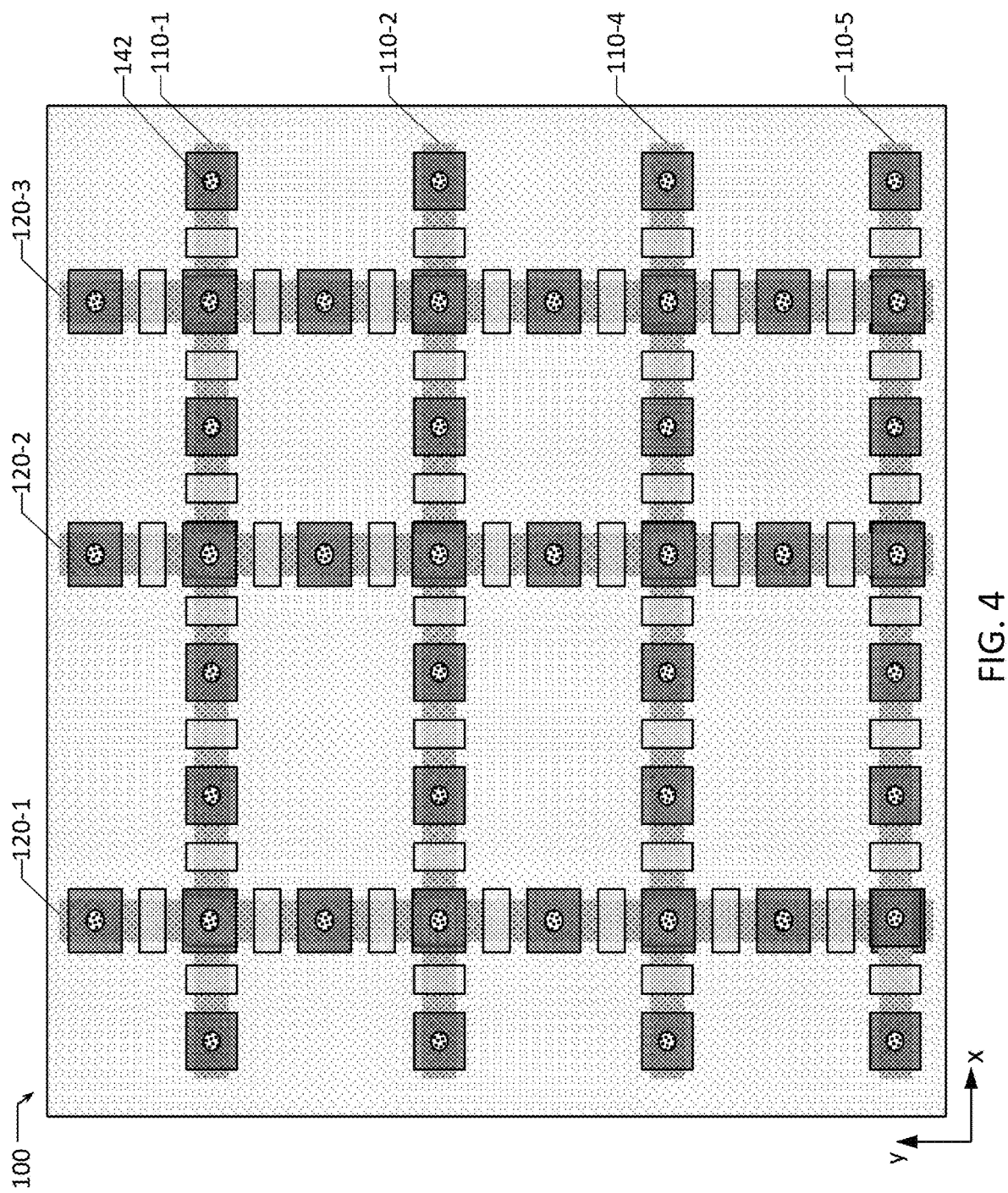
FIG. 4 is a top-down view of an example nanoribbon-based quantum dot device with a plurality of first nanoribbons intersecting a plurality of second nanoribbons at 90 degree angles, according to some embodiments.

FIG. 1 illustrates only two of the first nanoribbons 110 intersecting two of the second nanoribbons 120 in a quantum dot device 100. In other embodiments, larger numbers of nanoribbons 110, 120 may intersect, forming a larger 2D array in which quantum dots 142 may be formed. One example of such a larger array is shown in FIG. 4, providing a top-down view of an example nanoribbon-based quantum dot device 100 with a plurality of first nanoribbons 110 intersecting a plurality of second nanoribbons 120 at 90 degree angles, according to some embodiments. The example of FIG. 4 illustrates five nanoribbons 110 intersecting three nanoribbons 120 at 90 degree angles. Descriptions provided with respect to the nanoribbons 110, 120 for the quantum dot device 100 of FIGS. 1-3 are applicable to the quantum dot device 100 of FIG. 4, and, therefore, in the interests of brevity, are not repeated. In other embodiments, any other number of two or more nanoribbons 110 may intersect two or more nanoribbons 120 in a quantum dot device 100 in accordance with any embodiments described herein.

Figure 5:
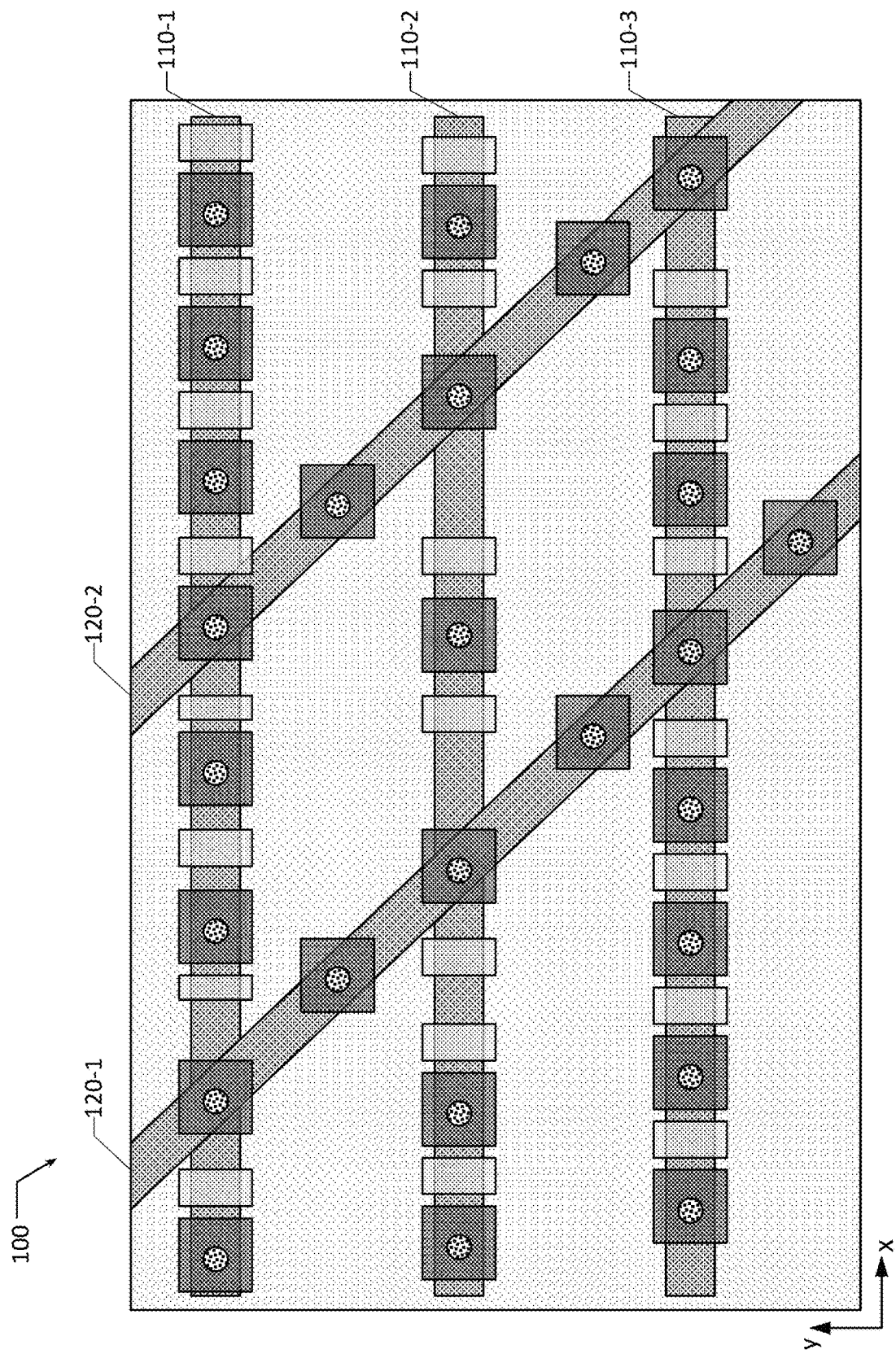
FIG. 5 is a top-down view of an example nanoribbon-based quantum dot device with a plurality of first nanoribbons intersecting a plurality of second nanoribbons at angles other than 90 degree angles, according to some embodiments.

FIG. 1 and FIG. 4 illustrate embodiments where the first nanoribbons 110 intersect the second nanoribbons 120 at 90 degree angles. In other embodiments, the angles of intersection may be different, an example of which is shown in FIG. 5, providing a top-down view of an example nanoribbon-based quantum dot device 100 with a plurality of first nanoribbons 110 intersecting a plurality of second nanoribbons 120 at angles other than 90 degree angles, according to some embodiments. Furthermore, FIG. 5 also illustrates that, in some embodiments, the spacing between the gates under which the quantum dots 142 are formed during operation of the quantum dot device 100 may vary in different nanoribbons. More generally, the arrays of quantum dot gates 106, 108 shown in FIG. 1 and FIG. 4 may be referred to as "dense" arras because a gate is provided at each point of a two-dimensional grid. However, in other embodiments, an example of which is FIG. 5, the quantum dot device 100 may include what may be referred to as a "sparse" or "sparser" array (if compared to some point of reference) of gates, where some of the gates may be missing, compared to the dense array arrangement. In such sparse arrays, some of the quantum dot gates 106, 108, may have less nearest neighbors than their counterparts in the dense arrays. Such quantum dot gates in the sparse arrays may experience reduced interference from neighboring quantum dot gates, and thus may exhibit fewer undesirable, unintended interactions (at the expense of fewer quantum dot gates per unit area).

Spacing two quantum dot gates further apart may reduce interference between the quantum dots associated with those quantum dot gates (e.g., due to the passive barrier provided by the intervening portion of the quantum well stack 146). The "sparse" arrangement of quantum dot gates in FIG. 5 is simply illustrative, and any of the quantum dot gates may be missing or replaced with stubs in any suitable arrangement in any of the embodiments of quantum dot devices 100 disclosed herein.

Except for the differences described above, descriptions provided with respect to the nanoribbons 110, 120 for the quantum dot device 100 of FIGS. 1-3 are applicable to the quantum dot device 100 of FIG. 5, and, therefore, in the interests of brevity, are not repeated. The example of FIG. 5 illustrates three nanoribbons 110 intersecting two nanoribbons 120 at non-90 degree angles. In other embodiments, any other number of two or more nanoribbons 110 may intersect two or more nanoribbons 120 at non-90 degree angles in a quantum dot device 100 in accordance with any embodiments described herein.

As discussed above, the quantum well stack 146 may include a quantum well layer in which a 2DEG or a 2DHG may form during operation of the quantum dot device 100. The quantum well stack 146 may take any of a number of forms, several of which are illustrated in FIGS. 6-8. The various layers in the quantum well stacks 146 discussed below may be grown on the support structure 102 (e.g., using epitaxial processes), and then shaped into nanoribbons 110, 120 to provide nanoribbon-based quantum dot devices 100 according to any of the embodiments described herein, or any combination of the embodiments described herein.

Although the singular term "layer" may be used to refer to various components of the quantum well stacks 146 of FIGS. 6-8, any of the layers discussed below may include multiple materials arranged in any suitable manner. In embodiments in which a quantum well stack 146 includes layers other than a quantum well layer 152, layers other than the quantum well layer 152 in a quantum well stack 146 may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope.

Figure 6:
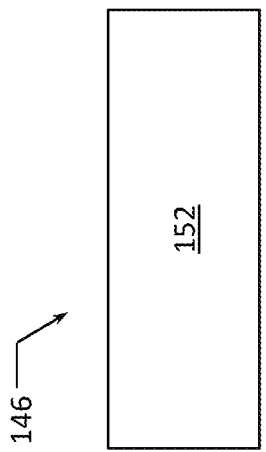

FIG. 6 is a cross-sectional view of a quantum well stack 146 including only a quantum well layer 152. The quantum well layer 152 may be disposed on the support structure 102, and may be formed of a material such that, during operation of the quantum dot device 100, a 2DEG may form in the quantum well layer 152 proximate to one or more surfaces of the quantum well layer 152 that are enclosed by the quantum dot gates 106, 108. The gate dielectric of the quantum dot gates of the quantum dot device 100 may be disposed on the one or more surfaces of the quantum well layer 152 so that the gate dielectric is between the quantum well layer 152 and the gate metal of the quantum dot gates of the quantum dot device 100. In some embodiments, the quantum well layer 152 of FIG. 6 may be formed of intrinsic silicon, and the gate dielectric may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 6 is formed of intrinsic silicon may be particularly advantageous for electron-type quantum dot devices 100. In some embodiments, the quantum well layer of FIG. 6 may be formed of intrinsic germanium, and the gate dielectric may be formed of germanium oxide; in such an arrangement, during use of the quantum dot device 100, a 2DHG may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 6 may take any suitable values. For example, in some embodiments, the thickness of the quantum well layer 152 (e.g., intrinsic silicon or germanium) may be between about 0.8 microns and 1.2 microns.

Figure 7:
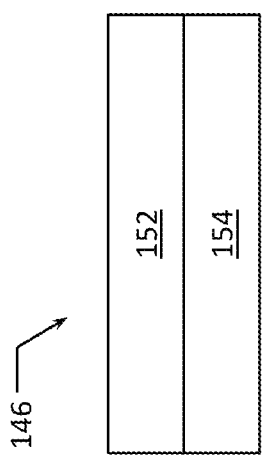

FIG. 7 is a cross-sectional view of a quantum well stack 146 including a quantum well layer 152 and a barrier layer 154. The quantum well stack 146 may be disposed on the support structure 102 such that the barrier layer 154 is disposed between the quantum well layer 152 and the support structure 102. The barrier layer 154 may provide a potential barrier between the quantum well layer 152 and the support structure 102. As discussed above with reference to FIG. 6, the quantum well layer 152 of FIG. 7 may be formed of a material such that, during operation of the quantum dot device 100, a 2DEG may form in the quantum well layer 152 proximate to one or more surfaces of the quantum well layer 152 that are enclosed by the quantum dot gates 106, 108. For example, in some embodiments in which the support structure 102 is formed of silicon, the quantum well layer 152 of FIG. 7 may be formed of silicon, and the barrier layer 154 may be formed of silicon germanium. The germanium content of this silicon germanium may be about 20-80% (e.g., about 30%). In some embodiments in which the quantum well layer 152 is formed of germanium, the barrier layer 154 may be formed of silicon germanium, e.g., with a germanium content of about 20-80% (e.g., about 70%). The thicknesses (i.e., z-heights) of the layers in the quantum well stack 146 of FIG. 7 may take any suitable values. For example, in some embodiments, the thickness of the barrier layer 154 (e.g., silicon germanium) may be between about 0 nanometers and 400 nanometers. In some embodiments, the thickness of the quantum well layer 152 (e.g., silicon or germanium) may be between about 5 nanometers and 30 nanometers.

Figure 8:
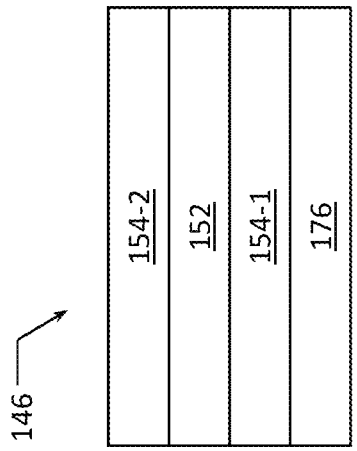
FIGS. 6-8 illustrate various embodiments of a quantum well stack that may be included in a nanoribbon-based quantum dot device, in accordance with various embodiments.

FIG. 8 is a cross-sectional view of a quantum well stack 146 including a quantum well layer 152 and a barrier layer 154-1, as well as a buffer layer 176 and an additional barrier layer 154-2. The quantum well stack 146 may be disposed on the support structure 102 such that the buffer layer 176 is disposed between the barrier layer 154-1 and the support structure 102. The buffer layer 176 may be formed of the same material as the barrier layer 154, and may be present to trap defects that form in this material as it is grown on the support structure 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the support structure 102 to the barrier layer 154-1; for example, the silicon germanium of the buffer layer 176 may have a germanium content that varies from zero percent at the silicon support structure 102 to a nonzero percent (e.g., about 30%) at the barrier layer 154-1. The thicknesses (i.e., z-heights) of the layers in the quantum well stack 146 of FIG. 8 may take any suitable values. For example, in some embodiments, the thickness of the buffer layer 176 (e.g., silicon germanium) may be between about 0.3 microns and 4 microns (e.g., between about 0.3 microns and 2 microns, or about 0.5 microns). In some embodiments, the thickness of the barrier layer 154-1 (e.g., silicon germanium) may be between about 0 nanometers and 400 nanometers. In some embodiments, the thickness of the quantum well layer 152 (e.g., silicon or germanium) may be between about 5 nanometers and 30 nanometers (e.g., about 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between about 25 nanometers and 75 nanometers (e.g., about 32 nanometers).

As discussed above with reference to FIG. 7, the quantum well layer 152 of FIG. 62 may be formed of a material such that, during operation of the quantum dot device 100, a 2DEG may form in the quantum well layer 152 proximate to one or more surfaces of the quantum well layer 152 that are enclosed by the quantum dot gates 106, 108. For example, in some embodiments in which the support structure 102 is formed of silicon, the quantum well layer 152 of FIG. 8 may be formed of silicon, and the barrier layer 154-1 and the buffer layer 176 may be formed of silicon germanium. In some such embodiments, the silicon germanium of the buffer layer 176 may have a germanium content that varies from the support structure 102 to the barrier layer 154-1; for example, the silicon germanium of the buffer layer 176 may have a germanium content that varies from zero percent at the silicon support structure 102 to a nonzero percent (e.g., about 30%) at the barrier layer 154-1. In other embodiments, the buffer layer 176 may have a germanium content about equal to the germanium content of the barrier layer 154-1 but may be thicker than the barrier layer 154-1 so as to absorb the defects that arise during growth.

In some embodiments, the quantum well layer 152 of FIG. 8 may be formed of germanium, and the buffer layer 176 and the barrier layer 154-1 may be formed of silicon germanium. In some such embodiments, the silicon germanium of the buffer layer 176 may have a germanium content that varies from the support structure 102 to the barrier layer 154-1; for example, the silicon germanium of the buffer layer 176 may have a germanium content that varies from zero percent at the support structure 102 to a nonzero percent (e.g., about 70%) at the barrier layer 154-1. The barrier layer 154-1 may in turn have a germanium content equal to the nonzero percent. In other embodiments, the buffer layer 176 may have a germanium content about equal to the germanium content of the barrier layer 154-1 but may be thicker than the barrier layer 154-1 so as to absorb the defects that arise during growth. In some embodiments of the quantum well stack 146 of FIG. 8, the buffer layer 176 and/or the barrier layer 154-2 may be omitted.

Various ones of the nanoribbons 110, 120 as described herein, may include any of the quantum well stacks 146 as described with reference to FIGS. 6-8, shaped to form nanoribbons. In some embodiments, nanoribbons 110, 120 of different layers above the support structure 102 may include different embodiments of the quantum well stacks 146 as described with reference to FIGS. 6-8.

Various embodiments of the quantum dot device 100, illustrated in the present drawings, do not represent an exhaustive set of nanoribbon-based quantum dot devices, but merely provide examples of such devices. In various embodiments, any of the features described with reference to one of the embodiments of the quantum dot device 100 may be combined with any of the features described with reference to another one of the embodiments. For example, even though FIGS. 2G-2J illustrate conductive vias as examples of the interconnects 116, 118, in other embodiments, any of the interconnects 116, 118 of the embodiments shown in FIGS. 2G-2J may be replaced by the interconnects 116, 118 of the embodiments shown in FIGS. 2C-2F. In another example, features related to absence of the gate metal of the quantum dot gates 106 and/or 108 at the bottom faces of the nanoribbons 110, 120 as shown in FIGS. 2I-2J, may be implemented in any of the embodiments shown in FIGS. 2A-2F.

Although particular arrangements of materials are discussed with reference to FIGS. 1-8, intermediate materials may be included in various portions of these figures. Note that FIGS. 1-8 are intended to show relative arrangements of some of the components therein, and that various device components of these figures may include other components that are not specifically illustrated, e.g., various interfacial layers or various additional components or layers. Additionally, although some elements of the quantum dot devices are illustrated in FIGS. 1-8 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. Therefore, descriptions of various embodiments of nanoribbon-based quantum dot devices, provided herein, are equally applicable to embodiments where various elements of the resulting devices look different from those shown in the figures due to manufacturing processes used to form them.

Figure 9:
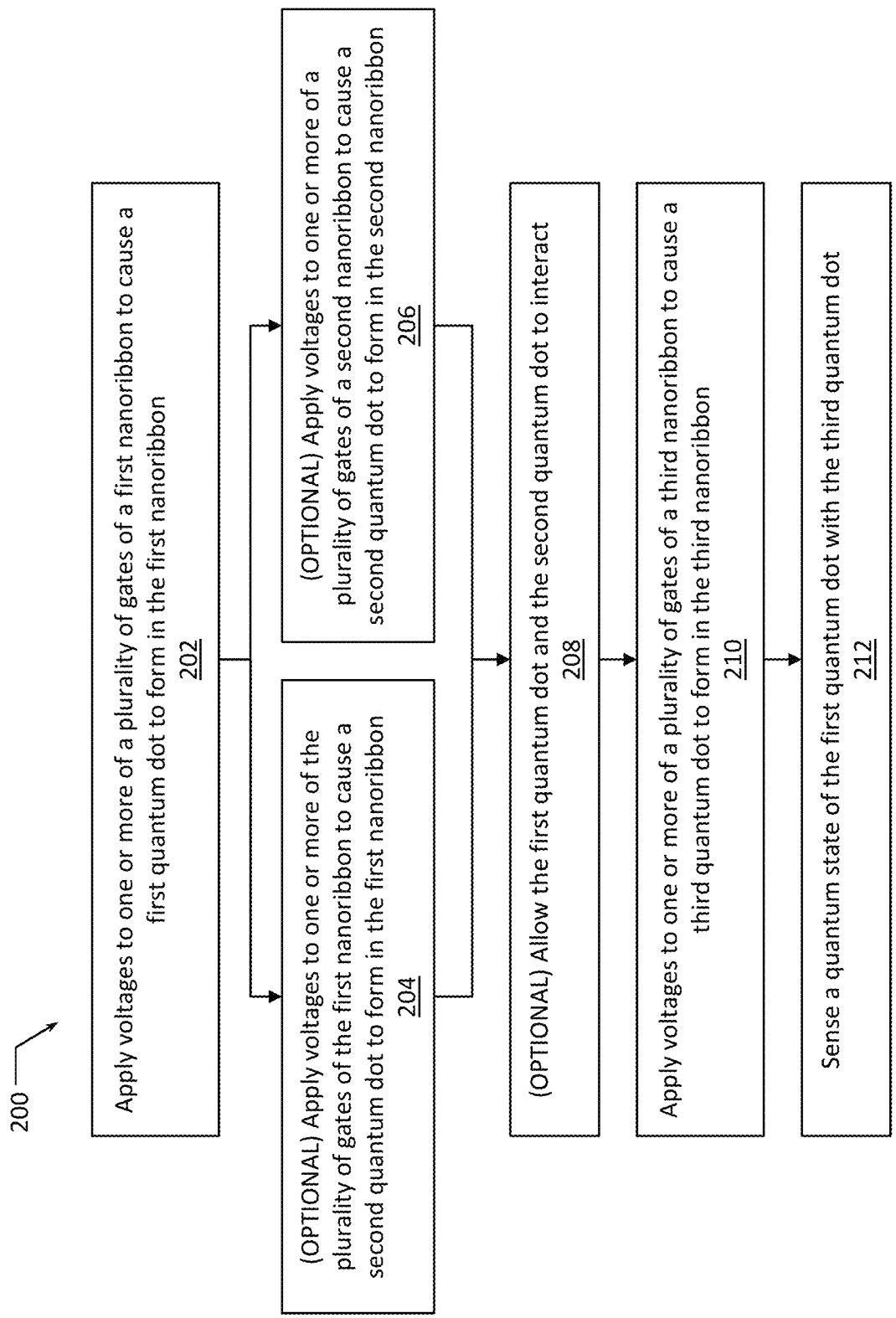
FIG. 9 is a flow diagram of a method of operating a nanoribbon-based quantum dot device, according to some embodiments.

FIG. 9 is a flow diagram of a method 200 of operating a nanoribbon-based quantum dot device, according to some embodiments. The method 200 may be used to fabricate the quantum dot devices 100 according to various embodiments described herein.

The method 200 may include an operation 202 that includes applying voltages to one or more of a plurality of gates of a first nanoribbon to cause a first quantum dot to form in the first nanoribbon. For example, the operation 202 may include applying voltages to one or more of the quantum dot gates 106, 108 of one of the nanoribbons 110 to cause a first quantum dot 142 to form in the nanoribbon 110.

In some embodiments, the method 200 may include an operation 204 or an operation 206, and, possibly, also an operation 208. The operation 204 may include applying voltages to one or more of the plurality of gates of the first nanoribbon to cause a second quantum dot to form in the first nanoribbon. For example, the operation 204 may include applying voltages to one or more of the quantum dot gates 106, 108 of one of the nanoribbons 110 to cause a second quantum dot 142, different from that formed in the operation 202, to form in the nanoribbon 110. The operation 206 may include applying voltages to one or more of a plurality of gates of a further nanoribbon (i.e., a nanoribbon that is different from that of the operations 202 or 204) to cause a second quantum dot to form in the further nanoribbon. For example, the operation 206 may include applying voltages to one or more of the quantum dot gates 106, 108 of one of the nanoribbons 120 to cause a second quantum dot 142 to form in the nanoribbon 120. The operation 208 may include allowing the first quantum dot, formed in the operation 202, and the second quantum dot, formed either in the operation 204 or in the operation 206, to interact, thus realizing a quantum logic operation.

The method 200 may also include an operation 210 that includes applying voltages to one or more of a plurality of gates of a third nanoribbon to cause a third quantum dot to form in the third nanoribbon. For example, the operation 202 may include applying voltages to one or more of the quantum dot gates 106, 108 of one of the nanoribbons 110', proximate to the one of the nanoribbons 110 that was the first nanoribbon in the operation 202, to cause a third quantum dot 142 to form in the nanoribbon 110'.

The method 200 may further include an operation 210 that includes sensing a quantum state of the first quantum dot, formed in the operation 202, using the third quantum dot, formed in the operation 210.

Figure 10:
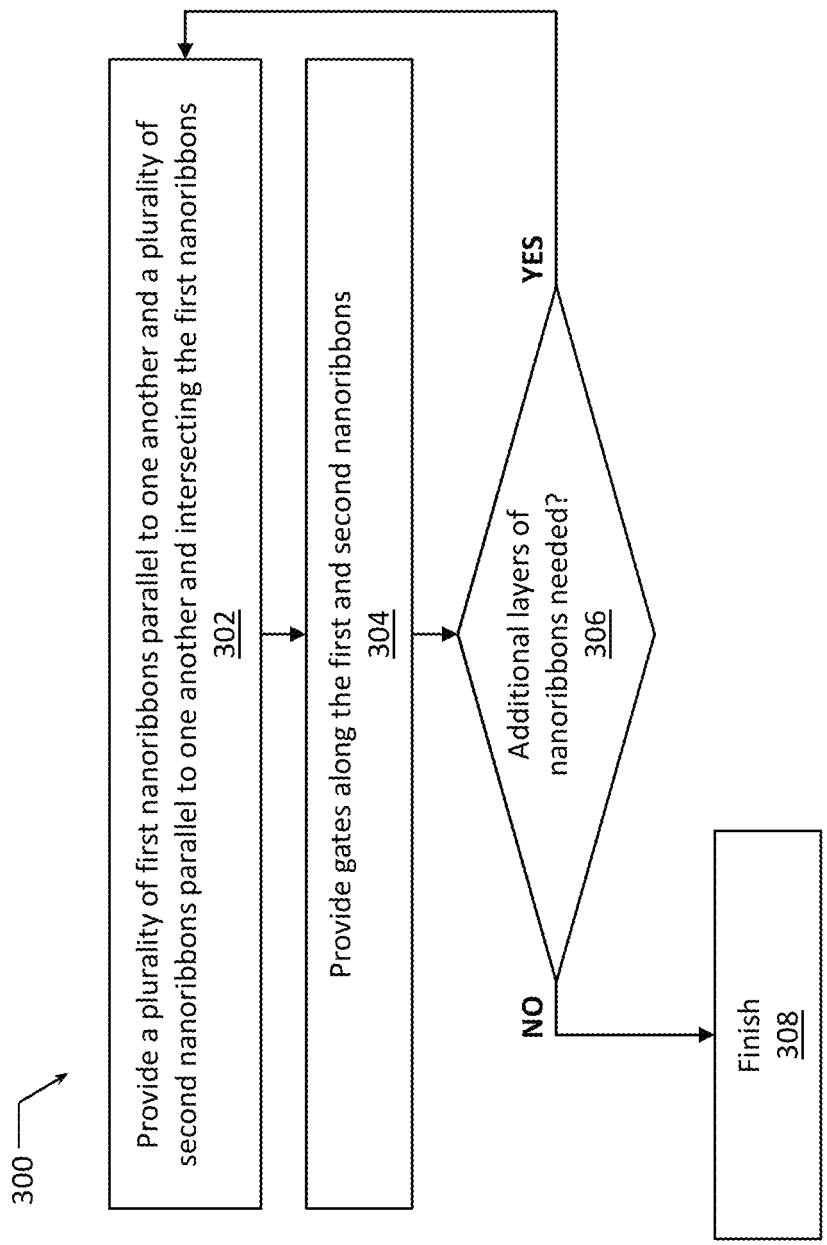
FIG. 10 is a flow diagram of a method of manufacturing a nanoribbon-based quantum dot device, according to some embodiments.

FIG. 10 is a flow diagram of a method 300 of manufacturing a nanoribbon-based quantum dot device, according to some embodiments. The method 300 may be used to fabricate the quantum dot device 100 according to any embodiment described herein.

Although the operations of the method 300 are illustrated once each and in a particular order, the operations may be performed in any suitable order and repeated as desired. For example, one or more operations may be performed in parallel to manufacture multiple nanoribbon-based quantum dot devices substantially simultaneously. In addition, the example manufacturing method 200 may include other operations not specifically shown in FIG. 10, such as various cleaning or planarization operations as known in the art. For example, in some embodiments, the support structure 102, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the intermediate quantum dot devices described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

The method 300 may include a process 302 that includes providing a plurality of first nanoribbons that are parallel to one another, and providing a plurality of second nanoribbons that are parallel to one another and intersect the first nanoribbons. For example, the process 302 may include providing the first nanoribbons 110 and the second nanoribbons 120, intersecting the first nanoribbons 110, according to any embodiments described herein. Each of the first and second nanoribbons provided in the process 302 may include a quantum well stack 146 as described herein, shaped as a nanoribbon. Once the quantum well stacks 146 that may form basis for forming the nanoribbons are deposited, any methods for forming nanoribbons as known in the art may be used to provide the first and second nanoribbons in the process 302.

The method 300 may include a process 304 that includes providing gates along the first and second nanoribbons provided in the process 302. For example, the process 304 may include providing the quantum dot gates 106, 108 according to any embodiments described herein.

If a particular design of a quantum dot device requires multiple 2D arrays of first and second nanoribbons intersecting one another, then the method 300 may include a process 306 that includes determining whether additional layers of crossing nanoribbons are needed. As shown in FIG. 3, if so, then the method 300 may proceed with repeating the process 302 and then the process 304. The processes 302 and 304 may be iterated as many times as needed to provide additional layers of the first and second nanoribbons intersecting one another. When it is no longer desired to provide more layers of crossing nanoribbons, the method 300 may finish in a process 308.

Nanoribbon-based quantum dot devices as described above may be implemented using any kind of qubit devices or be included in any kind of quantum processing devices/structures. Some examples of such devices/structures are illustrated in FIGS. 11-13.

Figure 11:
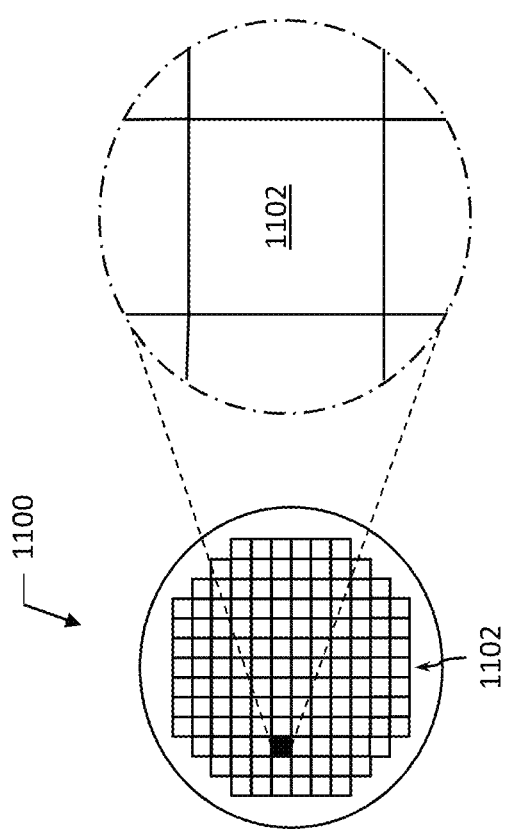
FIG. 11 is a top view of a wafer and dies that may include one or more of quantum dot devices disclosed herein.

FIG. 11 provides a top view of a wafer 1100 and dies 1102 that may be formed from the wafer 1100, according to some embodiments of the present disclosure. The dies 1102 may include any of the nanoribbon-based quantum dot devices disclosed herein, e.g., any embodiments of the quantum dot device 100 disclosed herein, or any combination of such embodiments. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 13) or other logic that is configured to store information in the memory devices or execute instructions stored in the memory array.

Figure 12:
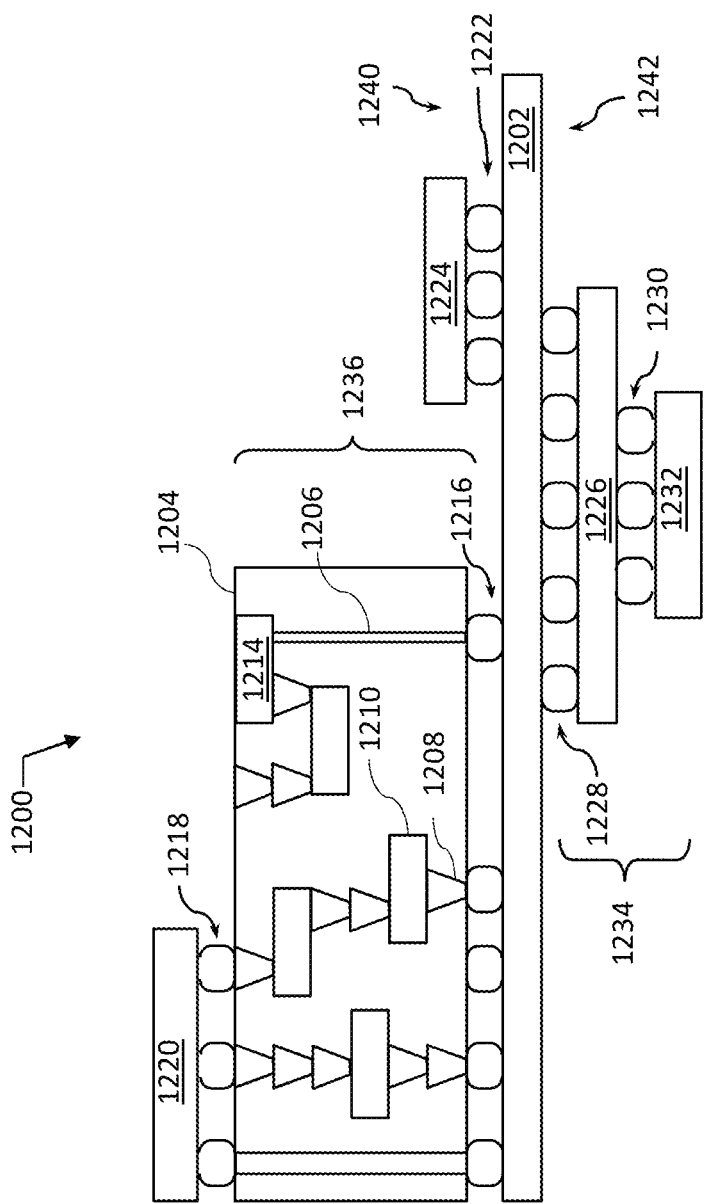
FIG. 12 is a cross-sectional side view of a device assembly that may include one or more of quantum dot devices disclosed herein.
Figure 13:
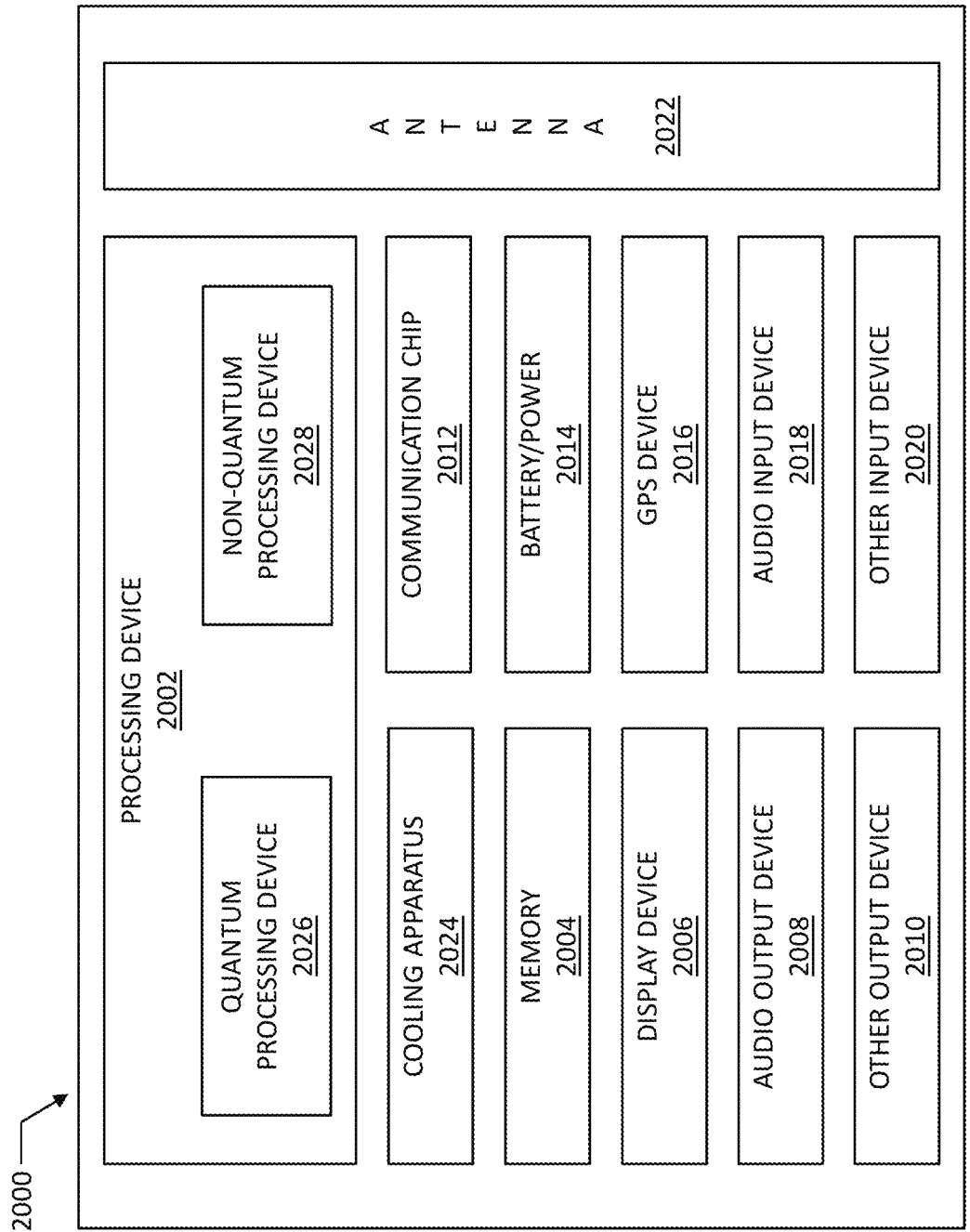
FIG. 13 is a block diagram of an example quantum computing device that may include one or more of quantum dot devices disclosed herein, in accordance with various embodiments.

FIG. 12 is a cross-sectional side view of a device assembly 1200 that may include any of the embodiments of the nanoribbon-based quantum dot devices as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 12 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 12, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the nanoribbon-based quantum dot devices as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 12, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any nanoribbon-based quantum dot devices disclosed herein; or may be a conventional IC package, for example.

The device assembly 1200 illustrated in FIG. 12 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

FIG. 13 is a block diagram of an example quantum computing device 2000 that may include any of the nanoribbon-based quantum dot devices as disclosed herein, or any combinations of such quantum dot devices. Several components are illustrated in FIG. 13 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the nanoribbon-based quantum dot devices as described herein. In some embodiments, various ones of these components may be fabricated onto a single system-on-a-chip (SoC) die. Additionally, in various embodiments, the quantum computing device 2000 may not include one or more of the components illustrated in FIG. 13, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the nanoribbon-based quantum dot devices as disclosed herein, and may perform data processing by performing operations on the qubits that may be generated in the quantum dot devices 100, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide examples of various ones of the embodiments disclosed herein.

Example 1 provides a quantum dot device that includes a support structure (e.g., a substrate, a chip, a wafer, or a die); a first nanoribbon provided over the support structure; a second nanoribbon provided over the support structure, where the second nanoribbon intersects the first nanoribbon, and where the first nanoribbon and the second nanoribbon include a quantum well stack that includes a quantum well layer and are substantially parallel to the support structure; a first gate, at least partially wrapping around a portion of the first nanoribbon; a second gate, at least partially wrapping around a portion of the second nanoribbon; and a third gate at an intersection of the first nanoribbon and the second nanoribbon.

Example 2 provides the quantum dot device according to example 1, where the first gate is one of a plurality of first gates, where an individual first gate of the plurality of first gates at least partially wraps around a different (i.e., respective) portion of the first nanoribbon; a first subset of one or more of the plurality of first gates is along a portion of the first nanoribbon that is on one side of the intersection; and a second subset of one or more of the plurality of first gates is along a portion of the first nanoribbon that is on another side of the intersection.

Example 3 provides the quantum dot device according to example 2, where a dimension of the individual first gate along a longitudinal axis of the first nanoribbon is between about 20 and 40 nanometers (e.g., about 30 nanometers).

Example 4 provides the quantum dot device according to examples 2 or 3, where a distance between two nearest first gates of the plurality of first gates (i.e., a dimension measured along a longitudinal axis of the first nanoribbon) is between about 1 and 20 nanometers (e.g., between about 1 and 10 nanometers, between about 3 and 7 nanometers, or between about 4 and 6 nanometers).

Example 5 provides the quantum dot device according to any one of examples 2-4, where the plurality of first gates are arranged in an array on the first nanoribbon and are spaced apart by a spacer material.

Example 6 provides the quantum dot device according to any one of examples 2-5, further including an insulating material provided over the support structure, where the first nanoribbon and the second nanoribbon are between the support structure and the insulating material; and a plurality of conductive vias, where each of the conductive vias extends through the insulating material and is in conductive contact with an associated gate of the plurality of first gates.

Example 7 provides the quantum dot device according to example 6, where at least one (but typically all) of the plurality of conductive vias includes a superconducting material.

Example 8 provides the quantum dot device of example 7, where the superconducting material includes tin.

Example 9 provides the quantum dot device of example 7, where the superconducting material includes aluminum.

Example 10 provides the quantum dot device of any of examples 6-9, where the insulating material is an oxide material.

Example 11 provides the quantum dot device according to any one of the preceding examples, further including an insulating material provided over the support structure, where the first nanoribbon and the second nanoribbon are between the support structure and the insulating material; a first conductive via extending through the insulating material and in conductive contact with the first gate; a second conductive via extending through the insulating material and in conductive contact with the second gate; and a third conductive via extending through the insulating material and in conductive contact with the third gate.

Example 12 provides the quantum dot device according to any one of the preceding examples, where at least one of the quantum dot device includes a first gate dielectric between a first gate metal of the first gate and the portion of the first nanoribbon, the quantum dot device includes a second gate dielectric between a second gate metal of the second gate and the portion of the second nanoribbon, and the quantum dot device includes a third gate dielectric between a third gate metal of the third gate and the intersection.

Example 13 provides the quantum dot device according to any one of the preceding examples, where the first nanoribbon and the second nanoribbon are in a first layer above the support structure, the quantum dot device further includes a third nanoribbon and a fourth nanoribbon in a second layer above the support structure, the first layer is between the support structure and the second layer, the fourth nanoribbon intersects the third nanoribbon, and the third nanoribbon and the fourth nanoribbon include a further quantum well stack that includes a further quantum well layer and are substantially parallel to the support structure.

Example 14 provides the quantum dot device according to example 13, where the third nanoribbon is stacked above the first nanoribbon (i.e., the first nanoribbon is between the support structure and the third nanoribbon), and the quantum dot device further includes a fourth gate, at least partially wrapping around a portion of the third nanoribbon.

Example 15 provides the quantum dot device according to example 14, where, during operation of the quantum dot device applying a voltage to the first gate causes a first quantum dot to form in the quantum well layer of the first nanoribbon or applying a voltage to the third gate causes a first quantum dot to form in the quantum well layer of the intersection of the first nanoribbon and the second nanoribbon; applying a voltage to the fourth gate causes a second quantum dot to form in the quantum well layer of the third nanoribbon; and the operation of the quantum dot device further includes sensing a quantum state of the first quantum dot with the second quantum dot.

Example 16 provides the quantum dot device according to any one of examples 13-15, where the third nanoribbon is stacked above the first nanoribbon (i.e., the first nanoribbon is between the support structure and the third nanoribbon), and the quantum dot device further includes a fifth gate at an intersection of the third nanoribbon and the fourth nanoribbon.

Example 17 provides the quantum dot device according to example 16, where, during operation of the quantum dot device applying a voltage to the first gate causes a first quantum dot to form in the quantum well layer of the first nanoribbon or applying a voltage to the third gate causes a first quantum dot to form in the quantum well layer of the intersection of the first nanoribbon and the second nanoribbon; applying a voltage to the fifth gate causes a second quantum dot to form in the quantum well layer of the intersection; and the operation of the quantum dot device further includes sensing a quantum state of the first quantum dot with the second quantum dot.

Example 18 provides the quantum dot device according to example 13, where the third nanoribbon is stacked above the first nanoribbon (i.e., the first nanoribbon is between the support structure and the third nanoribbon), the fourth nanoribbon is stacked above the second nanoribbon (i.e., the second nanoribbon is between the support structure and the fourth nanoribbon), and the quantum dot device further includes a fourth gate, at least partially wrapping around a portion of the third nanoribbon, a fifth gate, at least partially wrapping around a portion of the fourth nanoribbon, and a sixth gate at an intersection of the third nanoribbon and the fourth nanoribbon.

Example 19 provides the quantum dot device according to example 18, where the sixth gate is between the support structure and the third gate (i.e., the sixth gate is stacked above the third gate).

Example 20 provides the quantum dot device according to example 19, where at least one of the first gate is between the support structure and the fourth gate (i.e., the fourth gate is stacked above the first gate), and the second gate is between the support structure and the fifth gate (i.e., the fifth gate is stacked above the second gate).

Example 21 provides a quantum dot device that includes a plurality of first nanoribbons parallel to one another; and a plurality of second nanoribbons parallel to one another and intersecting with the first nanoribbons in a grid, where, for an individual first nanoribbon of the plurality of first nanoribbons, first gates at least partially wrap around associated respective portions of the individual first nanoribbon, for an individual second nanoribbon of the plurality of second nanoribbons, second gates at least partially wrap around associated respective portions of the individual second nanoribbon, and, for an individual intersection of one of the first nanoribbons and one of the second nanoribbons, a third gate is at (e.g., above, below, both above and below, or at least partially wraps around) the intersection.

Example 22 provides the quantum dot device according to example 21, further including a support structure (e.g., a substrate, a chip, a wafer, or a die), where the first nanoribbons and the second nanoribbons are parallel to the support structure (i.e., their longitudinal axes are parallel to the support structure), the first nanoribbons and the second nanoribbons include a quantum well stack that includes a quantum well layer, and the quantum well layer is parallel to the support structure.

Example 23 provides a method of operating a quantum dot device that includes a support structure, a first nanoribbon arrangement, and a second nanoribbon arrangement, the method including applying voltages to a first plurality of gates of the first nanoribbon arrangement to cause a first quantum dot to form in the first nanoribbon arrangement; applying voltages to a second plurality of gates of the second nanoribbon arrangement to cause a second quantum dot to form in the second nanoribbon arrangement; and sensing a quantum state of the first quantum dot with the second quantum dot, where the first nanoribbon arrangement includes a first nanoribbon intersecting a second nanoribbon, the second nanoribbon arrangement includes a third nanoribbon intersecting a fourth nanoribbon, the first nanoribbon and the second nanoribbon are in a first layer above the support structure, the third nanoribbon and the fourth nanoribbon are in a second layer above the support structure, the first layer is between the support structure and the second layer, the first plurality of gates includes a gate that at least partially wraps around a portion of the first nanoribbon, a gate that at least partially wraps around a portion of the second nanoribbon, and a gate at an intersection of the first nanoribbon and the second nanoribbon, and the second plurality of gates includes a gate that at least partially wraps around a portion of the third nanoribbon, a gate that at least partially wraps around a portion of the fourth nanoribbon, and a gate at an intersection of the third nanoribbon and the fourth nanoribbon.

Example 24 provides the method according to example 23, where the first nanoribbon, the second nanoribbon, the third nanoribbon, and the fourth nanoribbon are substantially parallel to the support structure.

Example 25 provides the method according to examples 23 or 24, where the first nanoribbon is between the support structure and the third nanoribbon.

Example 26 provides the method according to any one of examples 23-25, where the second nanoribbon is between the support structure and the fourth nanoribbon.

Example 27 provides the method according to any one of examples 23-26, where the intersection of the first nanoribbon and the second nanoribbon is between the support structure and the intersection of the third nanoribbon and the fourth nanoribbon.

Example 28 provides the method according to any one of examples 23-27, where the quantum dot device further includes an insulating material, and the voltages are applied to the second plurality of gates of the second nanoribbon arrangement through an associated plurality of conductive lines that extend through the insulating material to contact associated gates of the second plurality of gates.

Example 29 provides the method according to any one of examples 23-28, where sensing the quantum state of the first quantum dot with the second quantum dot includes sensing a spin state of the first quantum dot with the second quantum dot.

Example 30 provides the method according to any one of examples 23-29, further including applying voltages to the first plurality of gates of the first nanoribbon arrangement to cause a third quantum dot to form in the first nanoribbon arrangement; and, prior to sensing the quantum state of the first quantum dot with the second quantum dot, allowing the first and third quantum dots to interact.

Example 31 provides a quantum computing device that includes a quantum processing device, including a quantum dot device according to any one of the preceding examples, the quantum dot device including a plurality of gates according to any one of the preceding examples; a non-quantum processing device, coupled to the quantum processing device, to control voltages applied to the plurality of gates; and a memory device to store data generated during operation of the quantum processing device.

Example 32 provides the quantum computing device according to example 31, where the memory device is to store instructions for a quantum computing algorithm to be executed by the quantum processing device.

Example 33 provides the quantum computing device according to examples 31 or 32, further including a cooling apparatus to maintain a temperature of the quantum processing device below 5 degrees Kelvin.

Example 34 provides the quantum computing device according to example 33, where the cooling apparatus includes a dilution refrigerator.

Example 35 provides the quantum computing device according to example 33, where the cooling apparatus includes a liquid helium refrigerator.

Example 26 provides methods of manufacturing a quantum dot device and a quantum computing device according to any one of the preceding examples, e.g., any of the methods described herein.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum dot device, comprising:
a support structure;
a first nanoribbon over the support structure;
a second nanoribbon over the support structure, the second nanoribbon intersecting the first nanoribbon, where the first nanoribbon and the second nanoribbon include a quantum well stack that includes a quantum well layer and are substantially parallel to the support structure;
a first gate, at least partially wrapping around a portion of the first nanoribbon;
a second gate, at least partially wrapping around a portion of the second nanoribbon; and
a third gate at an intersection of the first nanoribbon and the second nanoribbon.

2. The quantum dot device according to claim 1, wherein:
the first gate is one of a plurality of first gates, where an individual first gate of the plurality of first gates at least partially wraps around a different portion of the first nanoribbon,
a first subset of one or more of the plurality of first gates is along a portion of the first nanoribbon that is on one side of the intersection, and
a second subset of one or more of the plurality of first gates is along a portion of the first nanoribbon that is on another side of the intersection.

3. The quantum dot device according to claim 2, wherein a dimension of the individual first gate along a longitudinal axis of the first nanoribbon is between about 20 and 40 nanometers.

4. The quantum dot device according to claim 2, wherein a distance between two nearest first gates of the plurality of first gates is between about 1 and 20 nanometers.

5. The quantum dot device according to claim 2, further comprising:
an insulating material over the support structure, where the first nanoribbon and the second nanoribbon are between the support structure and the insulating material; and
a plurality of conductive vias,
wherein individual ones of the conductive vias extend through the insulating material and are in conductive contact with corresponding gates of the plurality of first gates.

6. The quantum dot device according to claim 1, further comprising:
an insulating material over the support structure, where the first nanoribbon and the second nanoribbon are between the support structure and the insulating material;
a first conductive via extending through the insulating material and in conductive contact with the first gate;
a second conductive via extending through the insulating material and in conductive contact with the second gate; and
a third conductive via extending through the insulating material and in conductive contact with the third gate.

7. The quantum dot device according to claim 1, wherein at least one of:
the quantum dot device includes a first gate dielectric between a first gate metal of the first gate and the portion of the first nanoribbon,
the quantum dot device includes a second gate dielectric between a second gate metal of the second gate and the portion of the second nanoribbon, and
the quantum dot device includes a third gate dielectric between a third gate metal of the third gate and the intersection.

8. The quantum dot device according to claim 1, wherein:
the first nanoribbon and the second nanoribbon are in a first layer above the support structure,
the quantum dot device further includes a third nanoribbon and a fourth nanoribbon in a second layer above the support structure,
the first layer is between the support structure and the second layer,
the fourth nanoribbon intersects the third nanoribbon,
the third nanoribbon and the fourth nanoribbon include a further quantum well stack that includes a further quantum well layer, and
the third nanoribbon and the fourth nanoribbon are substantially parallel to the support structure.

9. The quantum dot device according to claim 8, wherein:
the third nanoribbon is stacked above the first nanoribbon, and
the quantum dot device further includes a fourth gate, at least partially wrapping around a portion of the third nanoribbon.

10. The quantum dot device according to claim 9, wherein, during operation of the quantum dot device:
applying a voltage to the first gate causes a first quantum dot to form in the quantum well layer of the first nanoribbon or applying a voltage to the third gate causes a first quantum dot to form in the quantum well layer of the intersection of the first nanoribbon and the second nanoribbon,
applying a voltage to the fourth gate causes a second quantum dot to form in the quantum well layer of the third nanoribbon, and
the operation of the quantum dot device further includes sensing a quantum state of the first quantum dot with the second quantum dot.

11. The quantum dot device according to claim 8, wherein:
the third nanoribbon is stacked above the first nanoribbon, and
the quantum dot device further includes a fifth gate at an intersection of the third nanoribbon and the fourth nanoribbon.

12. The quantum dot device according to claim 11, wherein, during operation of the quantum dot device:
applying a voltage to the first gate causes a first quantum dot to form in the quantum well layer of the first nanoribbon or applying a voltage to the third gate causes a first quantum dot to form in the quantum well layer of the intersection of the first nanoribbon and the second nanoribbon,
applying a voltage to the fifth gate causes a second quantum dot to form in the quantum well layer of the intersection, and
the operation of the quantum dot device further includes sensing a quantum state of the first quantum dot with the second quantum dot.

13. The quantum dot device according to claim 8, wherein:
the third nanoribbon is stacked above the first nanoribbon,
the fourth nanoribbon is stacked above the second nanoribbon, and
the quantum dot device further includes:
a fourth gate, at least partially wrapping around a portion of the third nanoribbon,
a fifth gate, at least partially wrapping around a portion of the fourth nanoribbon, and
a sixth gate at an intersection of the third nanoribbon and the fourth nanoribbon.

14. The quantum dot device according to claim 13, wherein the sixth gate is between the support structure and the third gate.

15. The quantum dot device according to claim 14, wherein at least one of:
the first gate is between the support structure and the fourth gate, and
the second gate is between the support structure and the fifth gate.

16. A quantum dot device, comprising:
a plurality of first nanoribbons parallel to one another; and
a plurality of second nanoribbons parallel to one another and intersecting with the first nanoribbons in a grid,
wherein:
for an individual first nanoribbon of the plurality of first nanoribbons, first gates at least partially wrap around associated respective portions of the individual first nanoribbon,
for an individual second nanoribbon of the plurality of second nanoribbons, second gates at least partially wrap around associated respective portions of the individual second nanoribbon, and
for an individual intersection of one of the first nanoribbons and one of the second nanoribbons, a third gate is at the intersection.

17. The quantum dot device according to claim 16, further comprising a support structure, wherein:
the first nanoribbons and the second nanoribbons are parallel to the support structure,
a body of each of the first nanoribbons and the second nanoribbons includes a respective quantum well stack that includes a quantum well layer, and
the quantum well layer is parallel to the support structure.

* * * * *